United States Patent
Tran et al.

(10) Patent No.: US 10,199,112 B1
(45) Date of Patent: Feb. 5, 2019

(54) SENSE AMPLIFIER CIRCUIT FOR READING DATA IN A FLASH MEMORY CELL

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Stanley Hong, San Jose, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/687,092

(22) Filed: Aug. 25, 2017

(51) Int. Cl.
*G11C 16/06* (2006.01)
*G11C 16/28* (2006.01)
*G11C 16/34* (2006.01)

(52) U.S. Cl.
CPC .......... *G11C 16/28* (2013.01); *G11C 16/3459* (2013.01)

(58) Field of Classification Search
CPC . G11C 7/1078; G11C 11/4076; G11C 29/028; G11C 29/50008; G11C 7/1051; G11C 7/1072; G11C 7/22; G11C 7/1006; G11C 7/1066; G11C 11/409; G11C 11/4093; G11C 11/4096
USPC ......... 365/230.03, 189.05, 201, 163, 185.18, 365/185.21, 189.02, 189.04, 189.17, 205, 365/230.06, 233.13, 148, 185.25
See application file for complete search history.

(56) References Cited

U.S. PATENT DOCUMENTS

2014/0036596 A1* 2/2014 Chan ...................... G11C 16/28 365/185.21

* cited by examiner

*Primary Examiner* — Thong Q Le
(74) *Attorney, Agent, or Firm* — DLA Piper LLP US

(57) ABSTRACT

Numerous embodiments for an improved sense amplifier circuit for reading data in a flash memory cell are disclosed. The embodiments each compare current or voltage measurements from a data block with a reference block to determine the value stored in the selected memory cell in the data block. The use of one or more localized boost circuits allow the embodiments to utilize lower operating voltages than prior art sense amplifier circuits, resulting in reduced power consumption.

78 Claims, 22 Drawing Sheets

SENSE AMPLIFIER CIRCUIT FOR READING DATA IN A FLASH MEMORY CELL

TECHNICAL FIELD

Numerous embodiments for an improved sense amplifier circuit for reading data in a flash memory cell are disclosed.

BACKGROUND OF THE INVENTION

Non-volatile memory cells are well known in the art. One prior art non-volatile split gate memory cell 10, which contains five terminals, is shown in FIG. 1. Memory cell 10 comprises semiconductor substrate 12 of a first conductivity type, such as P type. Substrate 12 has a surface on which there is formed a first region 14 (also known as the source line SL) of a second conductivity type, such as N type. A second region 16 (also known as the drain line) also of N type is formed on the surface of substrate 12. Between the first region 14 and the second region 16 is channel region 18. Bit line BL 20 is connected to the second region 16. Word line WL 22 is positioned above a first portion of the channel region 18 and is insulated therefrom. Word line 22 has little or no overlap with the second region 16. Floating gate FG 24 is over another portion of channel region 18. Floating gate 24 is insulated therefrom, and is adjacent to word line 22. Floating gate 24 is also adjacent to the first region 14. Floating gate 24 may overlap the first region 14 to provide coupling from the first region 14 into floating gate 24. Coupling gate CG (also known as control gate) 26 is over floating gate 24 and is insulated therefrom. Erase gate EG 28 is over the first region 14 and is adjacent to floating gate 24 and coupling gate 26 and is insulated therefrom. The top corner of floating gate 24 may point toward the inside corner of the T-shaped erase gate 28 to enhance erase efficiency. Erase gate 28 is also insulated from the first region 14. Memory cell 10 is more particularly described in U.S. Pat. No. 7,868,375, whose disclosure is incorporated herein by reference in its entirety.

One exemplary operation for erase and program of prior art non-volatile memory cell 10 is as follows. Memory cell 10 is erased, through a Fowler-Nordheim tunneling mechanism, by applying a high voltage on erase gate 28 with other terminals equal to zero volts. Electrons tunnel from floating gate 24 into erase gate 28 causing floating gate 24 to be positively charged, turning on the cell 10 in a read condition. The resulting cell erased state is known as '1' state.

Memory cell 10 is programmed, through a source side hot electron programming mechanism, by applying a high voltage on coupling gate 26, a high voltage on source line 14, a medium voltage on erase gate 28, and a programming current on bit line 20. A portion of electrons flowing across the gap between word line 22 and floating gate 24 acquire enough energy to inject into floating gate 24 causing the floating gate 24 to be negatively charged, turning off the cell 10 in a read condition. The resulting cell programmed state is known as '0' state.

Memory cell 10 is read in a Current Sensing Mode as following: A bias voltage is applied on bit line 20, a bias voltage is applied on word line 22, a bias voltage is applied on coupling gate 26, a bias or zero voltage is applied on erase gate 28, and a ground is applied on source line 14. There exists a cell current flowing from bit line 20 to source line 14 for an erased state and there is insignificant or zero cell current flow from the bit line 20 to the source line 14 for a programmed state. Alternatively, memory cell 10 can be read in a Reverse Current Sensing Mode, in which bit line 20 is grounded and a bias voltage is applied on source line 24. In this mode the current reverses the direction from source line 14 to bitline 20.

Memory cell 10 alternatively can be read in a Voltage Sensing Mode as following: A bias current (to ground) is applied on bit line 20, a bias voltage is applied on word line 22, a bias voltage is applied on coupling gate 26, a bias voltage is applied on erase gate 28, and a bias voltage is applied on source line 14. There exists a cell output voltage (significantly >0V) on bit line 20 for an erased state and there is insignificant or close to zero output voltage on bit line 20 for a programmed state. Alternatively, memory cell 10 can be read in a Reverse Voltage Sensing Mode, in which bit line 20 is biased at a bias voltage and a bias current (to ground) is applied on source line 14. In this mode, memory cell 10 output voltage is on the source line 14 instead of on the bit line 20.

In the prior art, various combinations of positive or zero voltages were applied to word line 22, coupling gate 26, and floating gate 24 to perform read, program, and erase operations In response to the read, erase or program command, the logic circuit 270 (in FIG. 2) causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

TABLE 1

Operation of Flash Memory Cell 10 Using Positive Voltages for Read, Erase, and Program

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | 0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | 0 V | 1 uA | Vinh | 10-11 V | 0-2.6 V | 0-2.6 V | 4.5-5 V | 0-2.6 V | 4.5-5 V | 0-1 V/FLT |

In a recent application by the applicant—U.S. patent application Ser. No. 14/602,262, filed on Jan. 21, 2015, which is incorporated by reference—the applicant disclosed an invention whereby negative voltages could be applied to word line 22 and/or coupling gate 26 during read, program, and/or erase operations. In this embodiment, the voltage and current applied to the selected and unselected memory cell 10, are as follows.

TABLE 2

Operation of Flash Memory Cell 10 Using Negative
Voltages for Read and/or Program

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/ 0 V | 0.6-2 V | 0 V-FLT | 0-2.6 V | 0-2.6 V | 0-2.6 V | 0-2.6 V | 0-2.6 V | 0 V | 0 V-FLT |
| Erase | 0 V | 0 V | 0 V | 0 V | 0 V | 0-2.6 V | 0-2.6 V | 11.5-12 V | 0-2.6 V | 0 V | 0 V |
| Program | 1 V | −0.5 V/ 0 V | 1 uA | Vinh | 10-11 V | 0-2.6 V | 0-2.6 V | 4.5-5 V | 0-2.6 V | 4.5-5 V | 0-1 V/FLT |

In another embodiment of U.S. patent application Ser. No. 14/602,262, negative voltages can be applied to word line 22 when memory cell 10 is unselected during read, erase, and program operations, and negative voltages can be applied to coupling gate 26 during an erase operation, such that the following voltages are applied:

TABLE 3

Operation of Flash Memory Cell 10 Using Negative Voltages for Erase

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V | 0-FLT | 0-2.6 V | 0-2.6 V | 0-2.6 V | 0-2.6 V | 0-2.6 V | 0 V | 0-FLT |
| Erase | 0 V | −0.5 V/0 V | 0 V | 0-FLT | −(5-9) V | 0-2.6 V | 0-2.6 V | 8-9 V | 0-2.6 V | 0 V | 0 V |
| Program | 1 V | −0.5 V/0 V | 1 uA | Vinh | 8-9 V | CGINH (4-6 V) | 0-2.6 V | 8-9 V | 0-2.6 V | 4.5-5 V | 0-1 V/FLT |

The CGINH signal listed above is an inhibit signal that is applied to the coupling gate 26 of an unselected cell that shares an erase gate 28 with a selected cell.

FIG. 2 depicts an embodiment of another prior art flash memory cell 210. As with prior art flash memory cell 10, flash memory cell 210 comprises substrate 12, first region (source line) 14, second region 16, channel region 18, bit line 20, word line 22, floating gate 24, and erase gate 28. Unlike prior art flash memory cell 10, flash memory cell 210 does not contain a coupling gate or control gate and only contains four terminals—bit line 20, word line 22, erase gate 28, and source line 14. This significantly reduces the complexity of the circuitry, such as decoder circuitry, required to operate an array of flash memory cells.

The erase operation (erasing through erase gate) and read operation are similar to that of the FIG. 1 except there is no control gate bias. The programming operation also is done without the control gate bias, hence the program voltage on the source line is higher to compensate for lack of control gate bias.

Table No. 4 depicts typical voltage ranges that can be applied to the four terminals for performing read, erase, and program operations:

FIG. 3 depicts an embodiment of another prior art flash memory cell 310. As with prior art flash memory cell 10, flash memory cell 310 comprises substrate 12, first region (source line) 14, second region 16, channel region 18, bit line 20, and floating gate 24, and erase gate 28. Unlike prior art flash memory cell 10, flash memory cell 310 does not contain a coupling gate or control gate or an erase gate. In addition, word line 322 replaces word line 22 and has a different physical shape than word line 22, as depicted.

One exemplary operation for erase and program of prior art non-volatile memory cell 310 is as follows. The cell 310 is erased, through a Fowler-Nordheim tunneling mechanism, by applying a high voltage on the word line 322 and zero volts to the bit line and source line. Electrons tunnel from the floating gate 24 into the word line 322 causing the floating gate 24 to be positively charged, turning on the cell 310 in a read condition. The resulting cell erased state is known as '1' state. The cell 310 is programmed, through a source side hot electron programming mechanism, by applying a high voltage on the source line 14, a small voltage on the word line 322, and a programming current on the bit line 320. A portion of electrons flowing across the gap between the word line 322 and the floating gate 24 acquire enough energy to inject into the floating gate 24 causing the floating gate 24 to be negatively charged, turning off the cell 310 in read condition. The resulting cell programmed state is known as '0' state.

TABLE 4

Operation of Flash Memory Cell 210

| | WL | WL-unsel | BL | BL-unsel | EG | EG-unsel | SL | SL-unsel |
|---|---|---|---|---|---|---|---|---|
| Read | 0.7-2.2 V | −0.5 V/0 V | 0.6-2 V | 0 V/FLT | 0-2.6 V | 0-2.6 V | 0 V | 0 V/FLT/VB |
| Erase | −0.5 V/0 V | −.5 V/0 V | 0 V | 0 V | 11.5 V | 0-2.6 V | 0 V | 0 V |
| Program | 1-1.5 V | −.5 V/0 V | 1-3 μA | Vinh (~1.8 V) | 4.5 V | 0-2.6 V | 7-9 V | 0-1 V/FLT |

Exemplary voltages that can be used for the read, program, erase, and standby operations in memory cell 310 are shown below in Table 5:

TABLE 5

Operation of Flash Memory Cell 310

| Operation | WL | BL | SL |
|---|---|---|---|
| Read | Vwlrd | Vblrd | 0 V |
| Program | Vwlp | Iprog/Vinh (unsel) | Vslp |
| Erase | Vwler | 0 V | 0 V |
| Standby | 0 V | 0 V | 0 V |

Vwlrd ~2-3 V
Vblrd ~0.8-2 V
Vwlp ~1-2 V
Vwler ~11-13 V
Vslp ~9-10 V
Iprog ~1-3 ua
Vinh ~2 V Also known in the prior art are numerous designs for sense amplifier circuits. Many of the prior art designs involve a comparator that compares voltages or currents from a data read block and a reference block, where the data read block contains a selected memory cell to be read, and the reference block contains a mechanism for generating a reference voltage or current. In the prior art, an operating voltage of at least 3.0 volts is typically required for some portions or all of the sense amplifier circuit.

What is needed are improved sense amplifier circuits that utilize a lower operating voltage compared to the prior art, thereby reducing the overall power consumption of the memory system.

SUMMARY OF THE INVENTION

Numerous embodiments for an improved sense amplifier circuit for reading data in a flash memory cell are disclosed. The embodiments each compare current or voltage measurements from a data block with a reference block to determine the value stored in the selected memory cell in the data block. The use of one or more localized boost circuits allow the embodiments to utilize lower operating voltages than prior art sense amplifier circuits, resulting in reduced power consumption.

DETAILED DESCRIPTION OF THE PREFERRED EMBODIMENT

Figure 1:
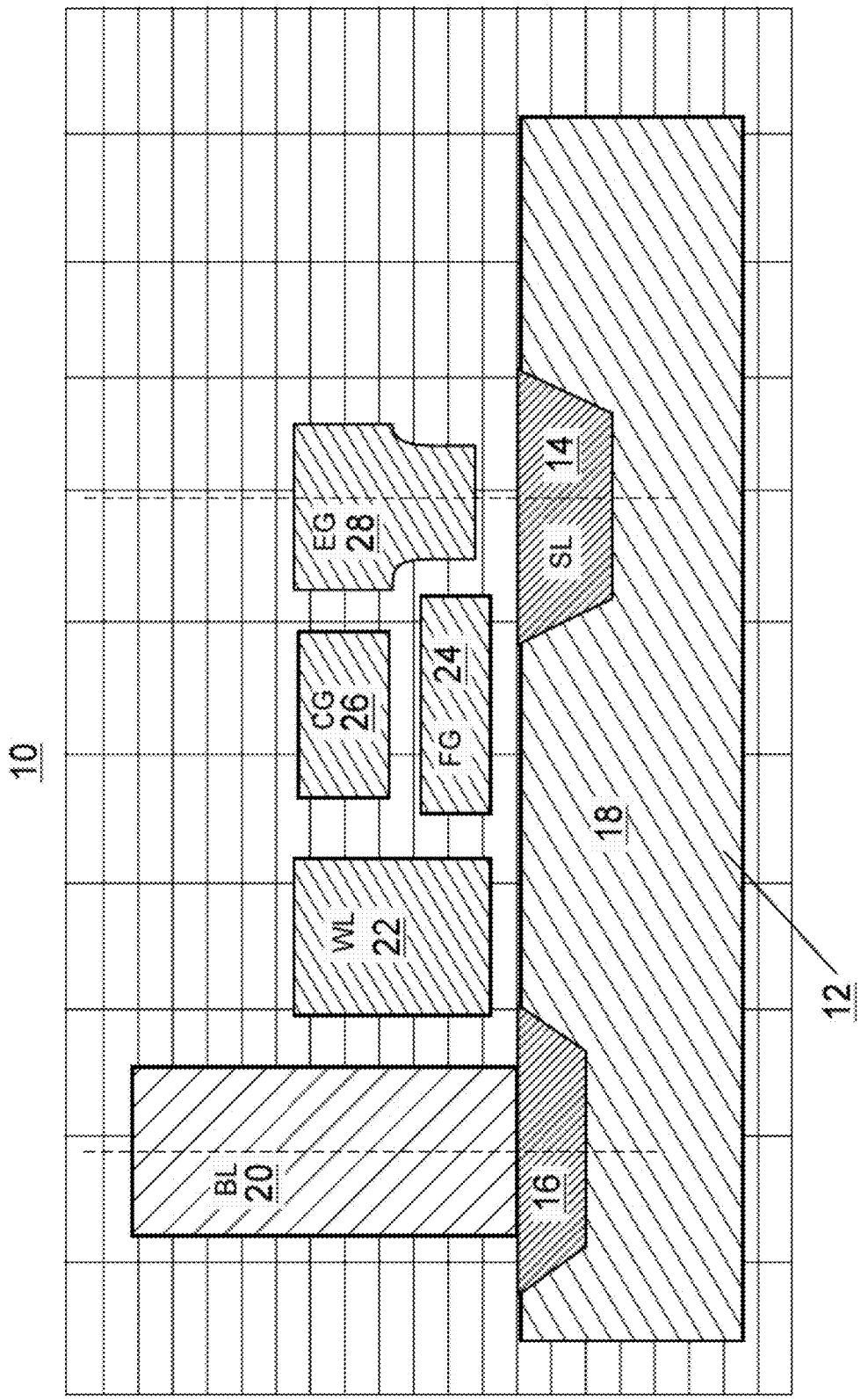
FIG. 1 is a cross-sectional view of a prior art non-volatile memory cell to which the invention can be applied.
Figure 2:
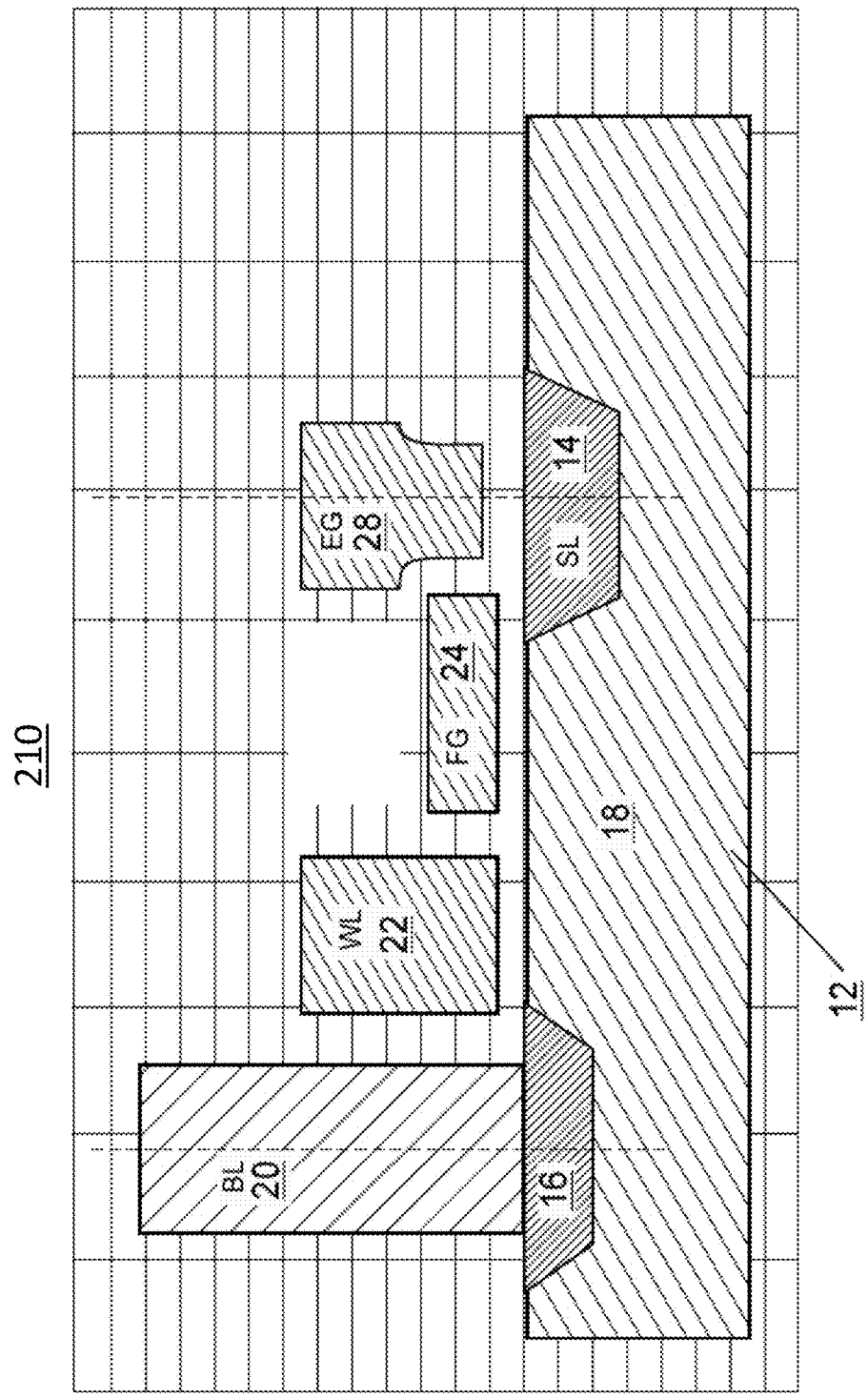
FIG. 2 is a cross-sectional view of another prior art non-volatile memory cell to which the invention can be applied.
Figure 3:
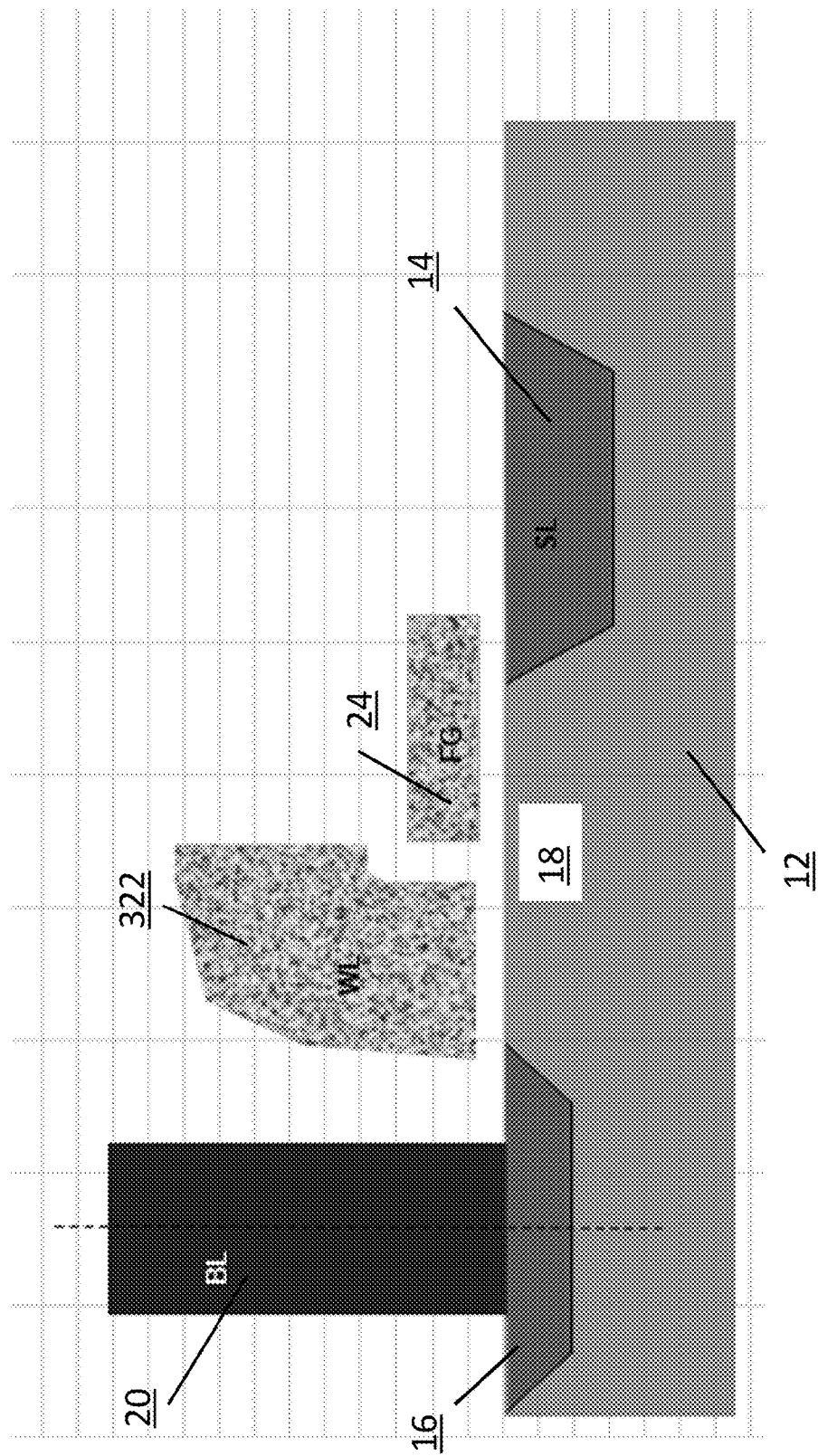
FIG. 3 is a cross-sectional view of another prior art non-volatile memory cell to which the invention can be applied.
Figure 4:
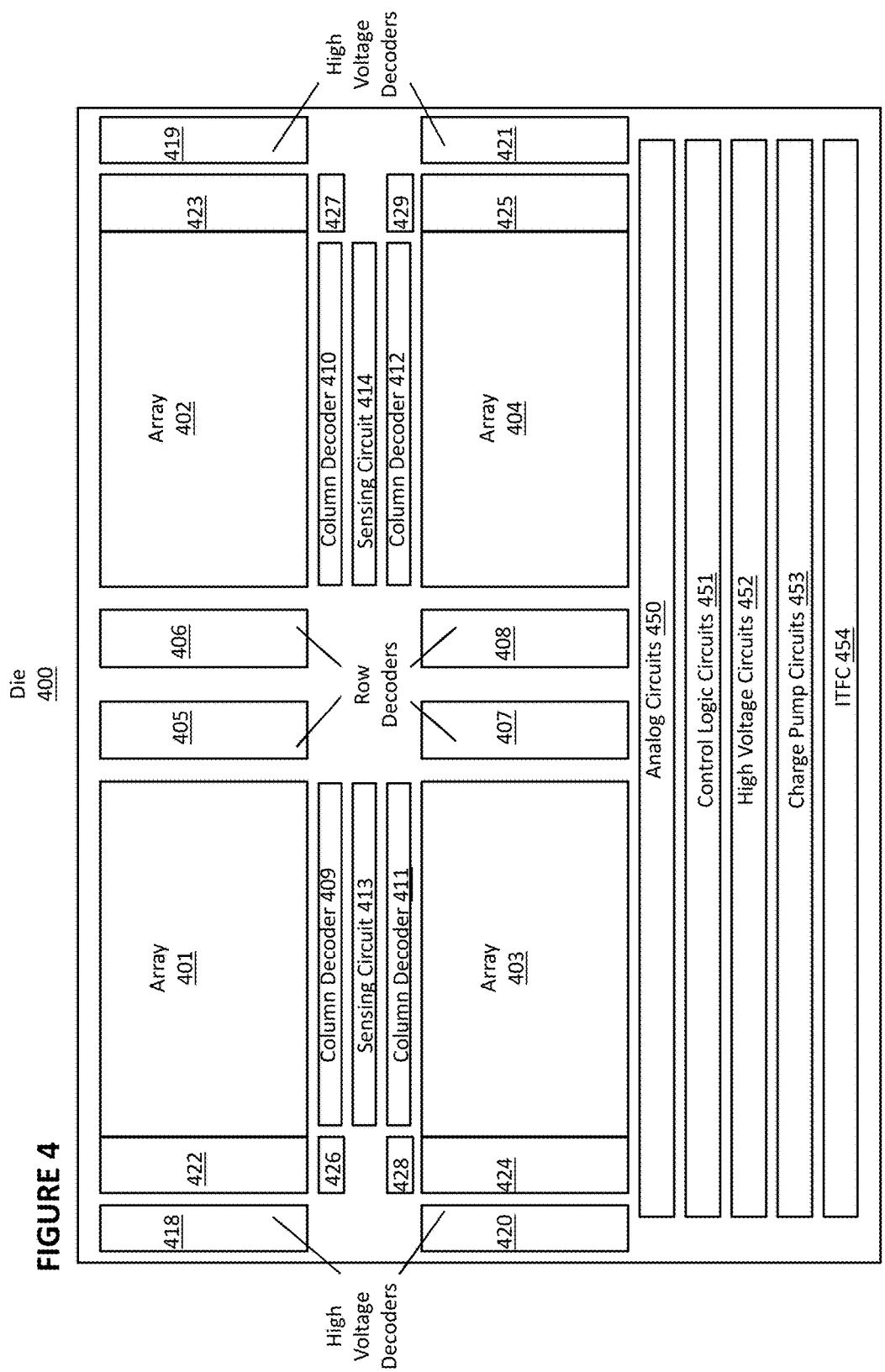
FIG. 4 is a layout diagram of a die comprising non-volatile memory cells of the type shown in FIGS. 1-3 in which the embodiments described herein can be used.

FIG. 4 depicts an embodiment of a flash memory system that can be used with the embodiments of the invention described herein. Die 400 comprises: memory arrays 401, 402, 403, and 404 for storing data, each memory array optionally utilizing memory cell 10 as in FIG. 1, memory cell 210 as in FIG. 2, memory cell 310 as in FIG. 3, or other known types of memory cells; row decoder circuits 405, 406, 407, and 408 used to access the row in memory arrays 401, 402, 403, and 404, respectively, to be read from or written to; column decoder circuits 409, 410, 411, and 412 used to access the column in memory arrays 401, 402, 403, and 404, respectively, to be read from or written to; sensing circuit 413 used to read data from memory arrays 401 and 403 and sensing circuit 414 used to read data from memory arrays 402 and 404; analog circuits 450; control logic circuits 451 for providing various control functions, such as redundancy and built-in self-testing; high voltage circuits 452 used to provide positive and negative voltage supplies for the system; charge pump circuits 453 to provide increased voltages for erase and program operations for memory arrays 401, 402, 403, and 404; interface pins 454 to connect to other nodes within the chip containing die 400; and high voltage decoder circuits 418, 419, 420, and 421 using during read, erase, and program operations as needed. Die 400 further comprises address fault detection blocks 422, 423, 424, and 425 and array fault detection sense circuits 426, 427, 428, and 429.

Figure 5:
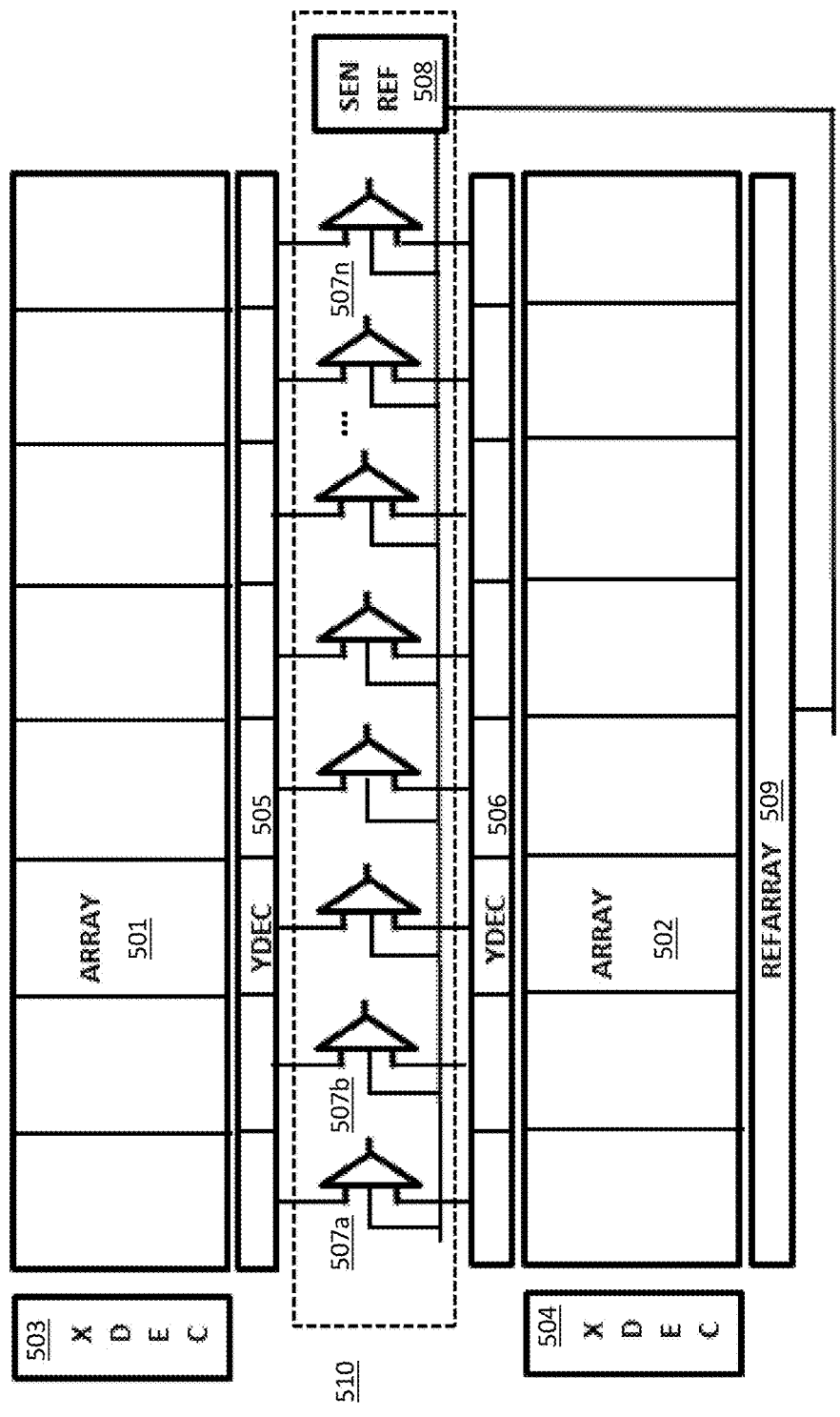
FIG. 5 depicts a flash memory system that can be implemented in the die of FIG. 4.

FIG. 5 depicts a flash memory system 500 (which can be implemented on die 400). Flash memory system 500 comprises arrays 501 and 502 (corresponding to arrays 401 and 403 in FIG. 4), row decoders 503 and 504 (corresponding to row decoders 405 and 407), column decoders 505 and 506 (corresponding to column decoders 409 and 411), and sensing circuit 510 (corresponding to sensing circuit 413). Flash memory system 500 further comprises reference array 509 and sensing circuit current reference 508.

Each column of flash memory cells in array 501 is coupled to a bit line, such that there is one bit line for every column in array 501. Similarly, each column of flash memory cells in array 502 is coupled to a bit line, such that there is one bit line for every column in array 502. Column decoders 505 and 506 connect selected bit lines to sensing circuit 510 during a read operation for a selected address. Sensing circuit 510 comprises a plurality of sense amplifier circuits 507a, 507b, . . . 507n, where n is the number of bit lines that can be read concurrently and is referred to as the TO width of flash memory system 500 (typically, n is 32 or 64). These sense amplifier circuits will be referred to collectively as sense amplifier circuits 507.

In this embodiment, reference array 509 is an array of dummy flash memory cells that are identical in structure to the flash memory cells of arrays 501 and 502 but which are not actually used to store user data. The reference array 509 serves to generate read reference bias for sensing both arrays 501 and 502. In an alternative embodiment, reference array 509 comprises regular reference transistors without flash memory cells. These regular reference transistors are sized and/or biased differently to provide different trip points (i.e., the current or voltage level that demarcates a "1" from a "0") for the sensing circuit 510. In another alternative embodiment, reference array 509 comprises regular reference resistors without flash memory cells. These regular reference resistors are sized differently to provide different trip points for the sensing circuit 510.

Sensing circuit current reference 508 is coupled to one or more of the dummy flash memory cells and generates a current. Using current mirror techniques, that current is mirrored in each of the sense amplifier circuits 507. The mirrored reference current is them compared against a selected memory cell from array 501 or 502 to generate an output that indicates the value of the data stored in the selected memory cell.

Figure 6:
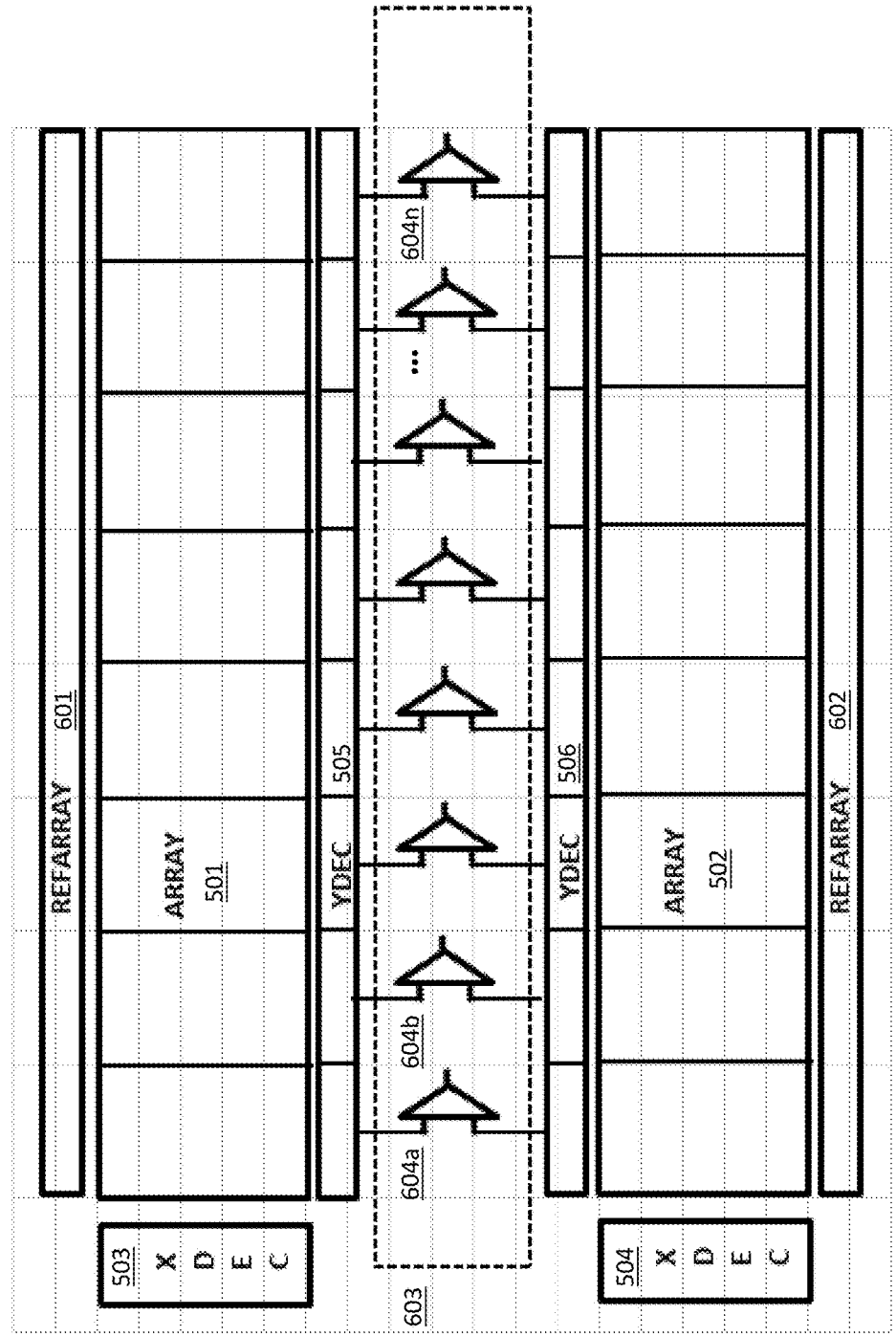
FIG. 6 depicts another flash memory system that can be implemented in the die of FIG. 4.

FIG. 6 depicts another flash memory system 600 (which can be implemented on die 400). Flash memory system 600, like flash memory system 500, comprises arrays 501 and 502, row decoders 503 and 504, and column decoders 505 and 506. Flash memory system 600 further comprises reference arrays 601 and 602 and sensing circuit 603.

Each column of flash memory cells in array 501 is coupled to a bit line, such that there is one bit line for every column in array 501. Similarly, each column of flash memory cells in array 502 is coupled to a bit line, such that there is one bit line for every column in array 502. Column decoders 505 and 506 connect selected bit lines to sensing circuit 603 during a read operation for a selected address. Sensing circuit 603 comprises a plurality of sense amplifier circuits 604a, 604b, . . . 604n, where n is the number of bit lines that can be read concurrently and is referred to as the IO width of flash memory system 600 (typically, n is 32 or 64). These sense amplifier circuits will be referred to collectively as sense amplifier circuits 604.

In this embodiment, reference arrays 601 and 602 both are an array of dummy flash memory cells that are identical in structure to the flash memory cells of arrays 501 and 502 but which are not actually used to store user data. When the selected memory cells are in array 501, each sense amplifier circuit 604 will be connected to a memory cell in reference array 602, where that memory cell will act as a reference memory cell. When the selected memory cells are in array 502, each sense amplifier circuit 604 will be connected to a memory cell in reference array 601 that will act as a reference memory cell. Thus, unlike flash memory system 500, flash memory system 600 does not require sensing circuit current reference 508 or the use of current mirrors. In another alternative embodiment, reference arrays 601 and 602 comprise regular reference transistors without flash memory cells. These regular reference transistors are sized and/or biased differently to provide different trip points for the sensing circuit 603. In another alternative embodiment, the reference arrays 601 and 602 comprise regular reference resistors without flash memory cells. These regular reference resistors are sized differently to provide different trip points for the sensing circuit 603.

Figure 7:
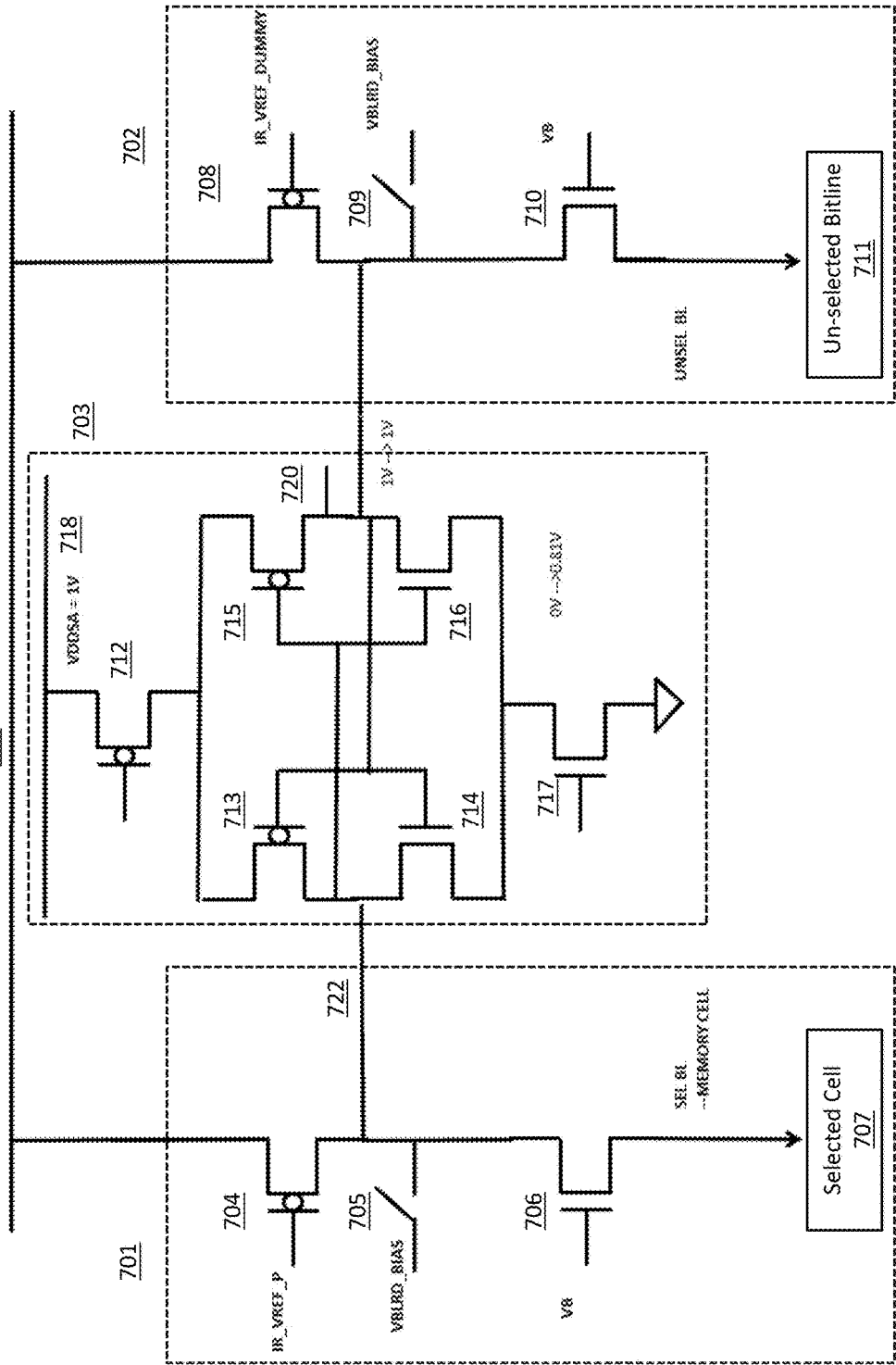
FIG. 7 depicts a sense amplifier circuit.

FIG. 7 depicts sense amplifier circuit 700. Sense amplifier circuit 700 comprises memory data read block 701, memory reference read block 702, and differential amplifier block 703.

Memory data read block 701 comprises sensing load PMOS transistor 704, switch 705 to apply a bias voltage VBLRD_BIAS to sensing node 722, and enabling sensing NMOS transistor 706 coupled to selected memory cell 707. Sensing load PMOS transistor 704 provides a read reference current to be compared versus the cell current from memory cell 707. The sensing node 722 goes high (toward VDDIO 719) if the read reference current from sensing load PMOS transistor 704 is larger than the memory cell current and goes low (toward ground) if the memory cell current is larger than the read reference current. The reference current from sensing load PMOS transistor 704 optionally can be provided using a current mirror configuration whereby it a current from a reference memory cell (as in FIG. 18). Alternatively, the reference current from sensing load PMOS transistor 704 can be provided using a current mirror configuration whereby it mirrors a current from a reference resistor or a reference transistor, appropriately sized or biased.

Memory reference read block 702 comprises sensing load PMOS transistor 708, switch 709 to apply a bias voltage VBLRD_BIAS on reference node 720, and enabling sensing NMOS transistor 701 coupled to an un-selected bitline (of unselected reference memory cell) 711. The un-selected bitline serves as a holding capacitor to hold the reference voltage VBLRD_BIAS on the sensing node 720. Alternatively, an explicit capacitor such as a MOMCAP (metal oxide metal cap) can be used as a holding capacitor. Alternatively, parasitic capacitances such as from a junction capacitance or a gate capacitance on node 720 can be used as a holding capacitor. The reference block 702 serves as a dummy block for reference node 720. The reference sensing lLad PMOS transistor 708 may be in an off state or may be used to provide a compensatory leakage current such as for leakage on node 720 from junction and/or transistor leakage on an un-selected bitline. The bias voltage level on VBLRD_BIAS serves as a reference voltage on reference node 720 to be compared against sensing voltage on the sensing node 722.

Differential amplifier block 703 comprises input cross coupled PMOS transistors 713 and 715 and input cross coupled NMOS transistors 714 and 716 together forming a comparator, PMOS enabling transistor 712 (which also acts as a transient bias tail current for the cross coupled PMOS transistor 713 and 715), and NMOS enabling transistor 717 (which also acts as a transient bias tail current for the cross coupled NMOS transistors 714 and 716). In comparison, the NMOS transistor 717 is enabled first to trigger the comparison from the NMOS transistors 714 and 716 to develop a voltage delta between node 720 and 722, and then the PMOS transistor 712 is enabled to start the comparison from the PMOS transistors 713 and 720, which restores the full power supply to both nodes 720 and 722. Alternatively, both NMOS transistor 717 and PMOS transistor 712 can be enabled simultaneously to trigger the comparison.

During operation, differential amplifier block 703 will compare sensing node 722 created by memory data read block 701 and reference node 720 created by memory reference read block 702 to generate output 720. Initially, the voltages on nodes 722 and 720 are initialized at the same reference voltage level VBLRD_BIAS (by the switches 705 and 709). Then the voltage on sensing node 722 is developed (going high or low depending on the selected memory cell current 707 is less or more than the read reference current conducting in the PMOS transistor 704). Then the comparison is triggered to compare the voltage on sensing node 722 versus the voltage on reference node 720 (by transistors 717 and 712). The final voltage on sensing node 722 and reference node 720 is at full supply level after the comparison is completed.

If the read reference current conducting in transistor 704 exceeds the memory cell current drawn from memory cell 707 (signifying that a "0" is stored in the selected memory cell), then output 720 will be low. If the read reference current in transistor 704 is less than the memory cell current drawn from memory cell 707 (signifying that a "1" is stored in the selected memory cell), then output 720 will be high.

Memory data read block 701 and memory reference read block 702 draw power from power bus 719 (also labeled VDDIO, i.e., IO power supply), which typically is around 3.0 volts. Differential amplifier block 703 draws power from power bus 718 (also labeled VDDSA, typically core logic power supply), which typically is around 1.05 volts or lower for scaled technology node such as 28 nm or smaller. To get high memory cell current for high performance requirements, the read bitline voltage needs to be as high as possible, meaning the voltage on node 722 needs to be high, such as 1 v to 1.4 v. This means transistor 704 needs to work from a voltage supply that is much higher than the core logic supply of typically <=1.05 v. Hence, circuit blocks 701 and 702 need to work at IO supply, which is much higher than the core logic supply. This means circuit blocks 701 and 702 will include 3 v IO transistors, which require a relatively large area.

Figure 8:
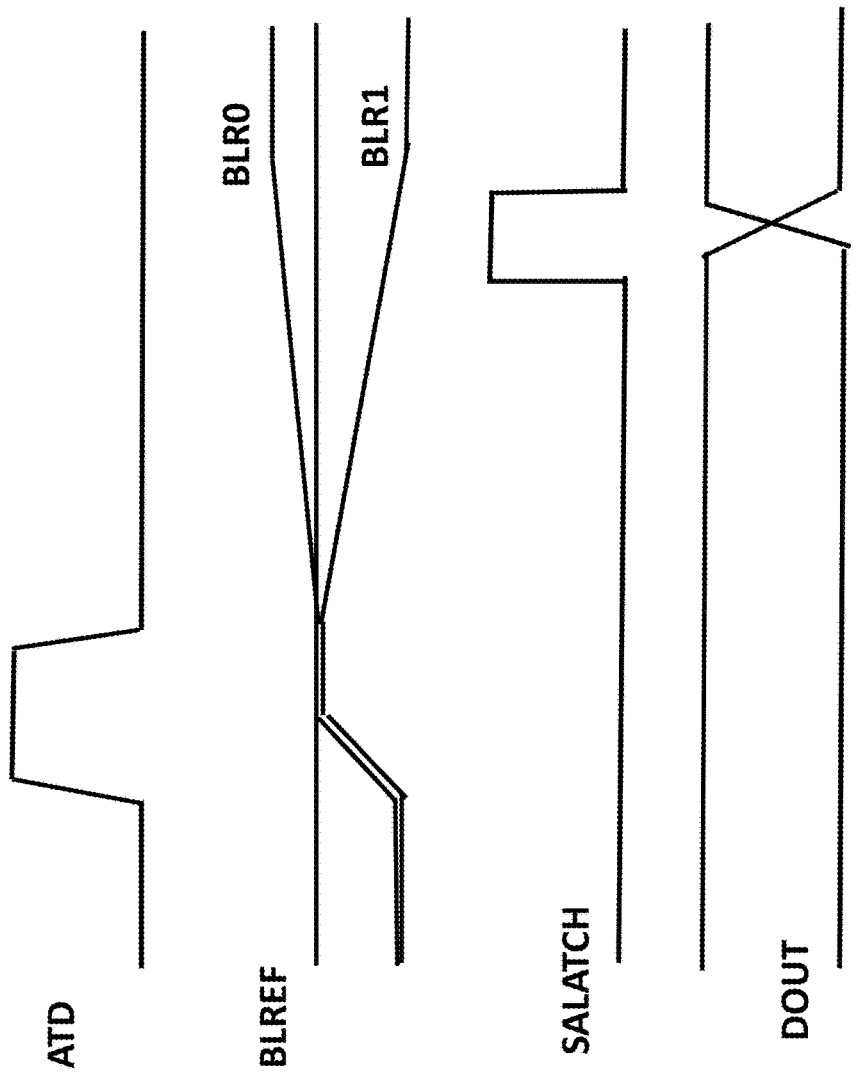
FIG. 8 depicts various waveforms of certain characteristics of the sense amplifier circuit of FIG. 7.

FIG. 8 depicts exemplary waveforms 800 for the operation of sense amplifier circuit 700. ATD represents "address transition detection," and generates a pulse when an address is received, here signifying the start of a read operation. During the ATD period (also known as equalizing or pre-charging period) the voltages on selected bitline BLR0/1 and reference bitline BLREF are equalized to a voltage reference level. BLREF is the voltage at the node where memory reference read block 702 connects to differential amplifier block 703. BLR0 depicts the voltage at the node where memory data read block 701 connects to differential amplifier block 703 in the situation where selected memory cell 707 contains a "0" (i.e., the program state). BLR1 depicts the voltage at such node in the situation where selected memory cell 707 contains a "1." (i.e., the erase state). DOUT represents the voltage on output 720, and SALATCH represents a signal used to latch output 720. Thus, it can be seen that voltage BLR0/1 goes high after the equalizing period (ATD period) for the memory cell '0' (program state) and goes low for memory cell '1' (erase state). The DOUT signal goes low for the reading memory cell '0' (BLR0>BLREF) and goes high for reading memory cell '1' (BLR1<BLREF).

Embodiments of improved sense amplifier circuits that consume less power than sense amplifier circuit 700 will now be described with reference to FIGS. 9-16. Each embodiment of an improved sense amplifier circuit can be used as sense amplifier circuit 507 or 604 in FIGS. 5 and 6.

Figure 9:
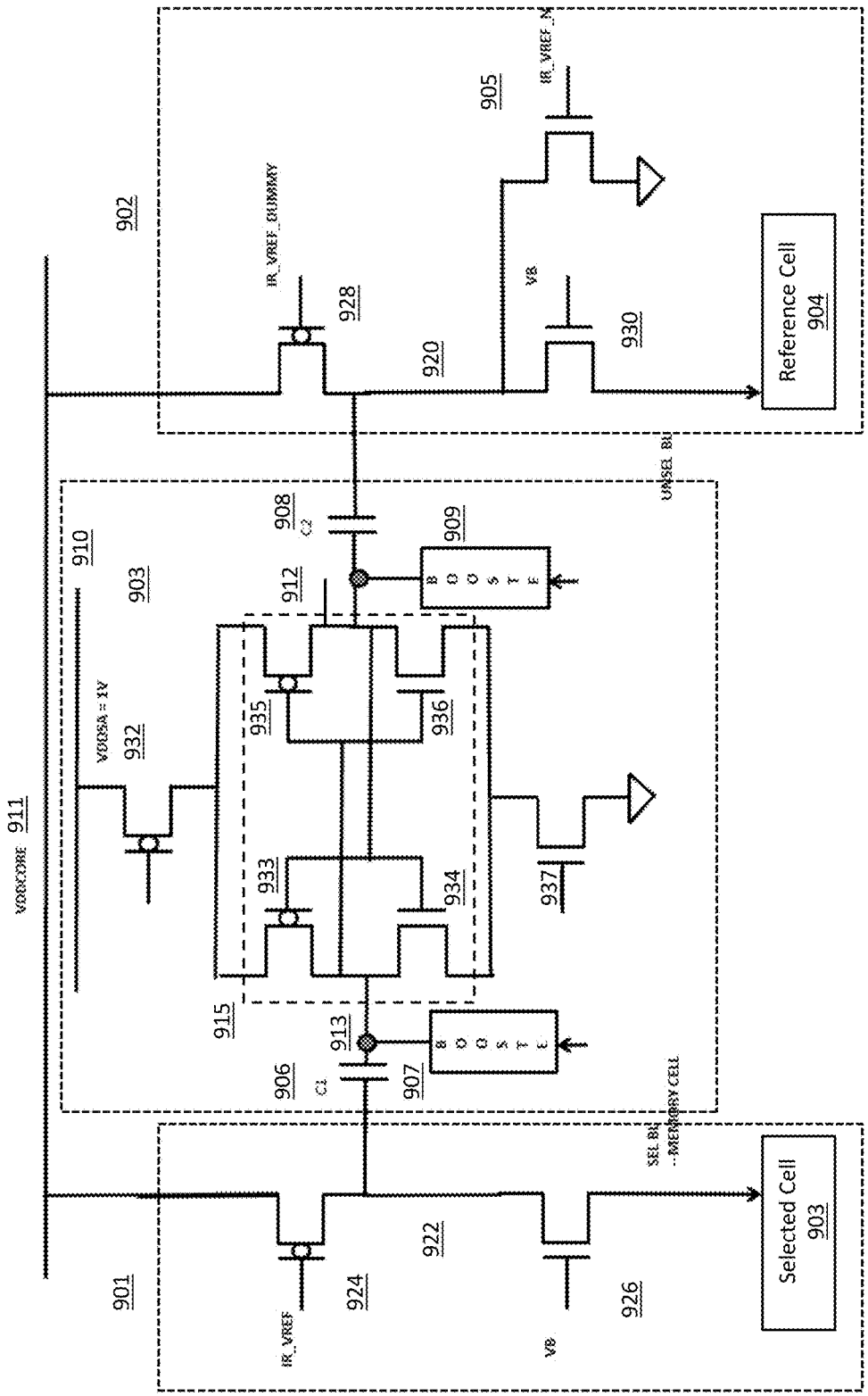
FIG. 9 depicts another embodiment of a sense amplifier circuit.

An embodiment of an improved sense amplifier circuit is shown in FIG. 9. Sense amplifier circuit 900 comprises memory data read block 901 connected to selected memory cell 903, memory reference read block 902 connected to reference cell 904, and differential amplifier block 903. Memory data read block 901, memory reference read block 902, and differential amplifier block 903 contain many of the same components described previously for memory data read block 701, memory reference read block 702, and differential amplifier block 703, and those components will not be described again here for efficiency's sake. Memory data read block 901 provides sensing node 922, which couples to a selected bitline (which is connected to selected memory cell 903). Memory reference read block 902 provides sensing node 920, which couples to a reference bitline and a read reference current (NMOS transistor 905). PMOS transistors 924 and 928 serve to pre-charge the selected bitline and the reference bitline to a reference read voltage level. PMOS transistors 924 and 928 can also serve to compensate unwanted leakage on the selected bitline and the reference bitline by biasing those lines at an appropriate leakage compensation level after pre-charging.

Memory reference read block 902 comprises NMOS transistor 905, which acts as a read reference current source and effectively diverts current from the node at which memory reference read block 902 connects to differential amplifier block 903.

Differential amplifier block 903 comprises capacitor 906, which decouples differential amplifier block 903 from memory data read block 901, and capacitor 908, which decouples differential amplifier block 903 from memory reference read block 902. Differential amplifier block 903 further comprises boost circuit 907 and boost circuit 909, which provide a transient, local voltage boost (after the pre-charging) to the input nodes of comparator 915 (nodes 912 and 913, gate/drain nodes of input cross-coupled pair NMOS transistor 934 and 936) within differential amplifier block (for example, boosting the voltage from 1.05 volts to 1.3 volts). Alternatively, the entirety of differential amplifier block 903 can be boosted to another high voltage level higher than the core logic supply.

During operation, differential amplifier block 903 will compare the current drawn by memory data read block 901 and memory reference read block 902 to generate output 912. If the current drawn by memory data read block 901 exceeds the reference current drawn from memory reference read block 902 (signifying that a "0" is stored in the selected memory cell), then output 912 will be low. If the current drawn from memory data read block 901 is less than the current drawn from memory reference read block 902 (signifying that a "1" is stored in the selected memory cell), then output 912 will be high.

Memory data read block 901 and memory reference read block 902 draw power from power bus 911 (also labeled VDDCORE), which typically is around 1.05 volts or lower for scaled technology such as 28 nm or smaller. Differential amplifier block 903 draws power from power bus 910 (also labeled VDDSA), which typically is around 1.05 volts, sometimes known as the core logic supply. By contrast, it will be recalled that in FIG. 7, memory data read block 701 and memory reference read block 702 required an TO supply power source of 3.0 volts. Thus, sense amplifier circuit 900 consumes less power than sense amplifier circuit 700. Since sense amplifier circuit 900 works from the core logic supply, the transistors required are also of core logic transistors, hence the area of the sense amplifier 900 is smaller than that of the sense amplifier 700.

Figure 10:
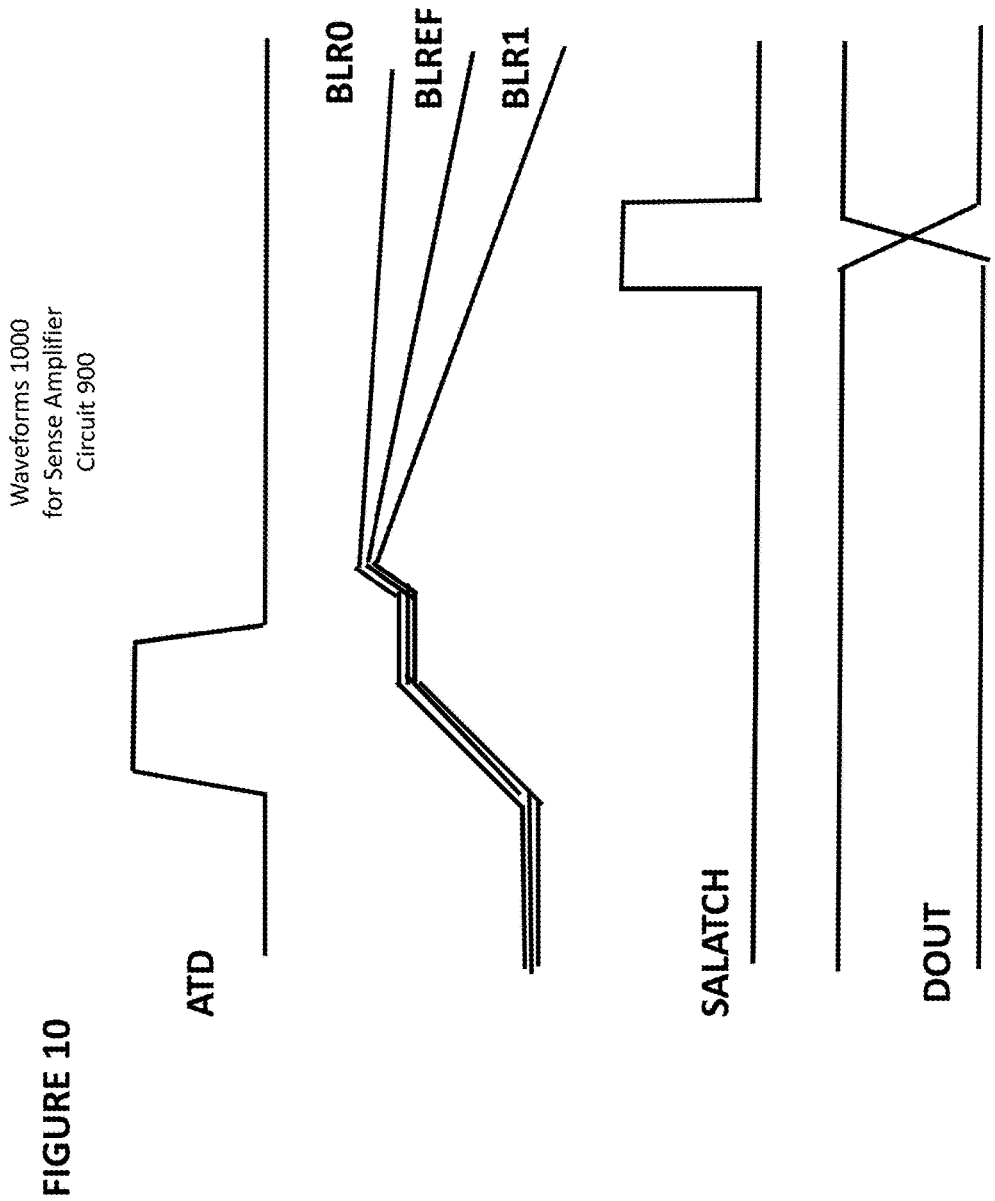
FIG. 10 depicts various waveforms of certain characteristics of the sense amplifier circuit of FIG. 9.

FIG. 10 depicts exemplary waveforms 1000 for the operation of sense amplifier circuit 900. ATD represents "address transition detection," and generates a pulse when an address is received, here signifying the start of a read operation. During the ATD period (also known as equalizing or pre-charging period) the voltages on selected bitline BLR0/1 and reference bitline BLREF are equalized to a voltage reference level. BLREF is the voltage at the node where memory reference read block 902 connects to differential amplifier block 903. BLR0 depicts the voltage at the node where memory data read block 902 connects to differential amplifier block 903 in the situation where selected memory cell 903 contains a "0." BLR1 depicts the voltage at such node in the situation where selected memory cell 902 contains a "1." DOUT represents the voltage on output 912, and SALATCH represents a signal used to latch output 912. Thus, it can be seen that the voltages BLR0/BLR1/BLREF are locally boosted to another higher voltage level, e.g., from 0.8 v to 1.3 v. Then after the local boosting, the voltage BLR0/1 goes low for the memory cell '0' (program state) and for memory cell '1' (erase state). The ramping down rate of selected bitline BLR0 (reading memory cell '0') is slower than that of the reference bitline BLREF. The ramping down rate of selected bitline BLR1 (reading memory cell '1') is faster than that of the reference bitline BLREF. The DOUT signal goes low for the reading memory cell '0' (BLR0>BLREF) and goes high for reading memory cell '1' (BLR1<BLREF).

In contrast to FIG. 8, it can be seen in FIG. 10 that BLREF, BLR0, and BLR1 decrease over time. Those signals initially start high due to the localized boost voltage provided by boost circuits 907 and 909 at the beginning of the sense operation (after ATD equalizing period). That voltage decreases over time from the lower operating voltage obtained from power bus 911 as well as the current drawn by selected cell 903, reference cell 904, and read reference current NMOS transistor 905. This results in power savings compared to the corresponding waveforms of FIG. 8.

Figure 11:
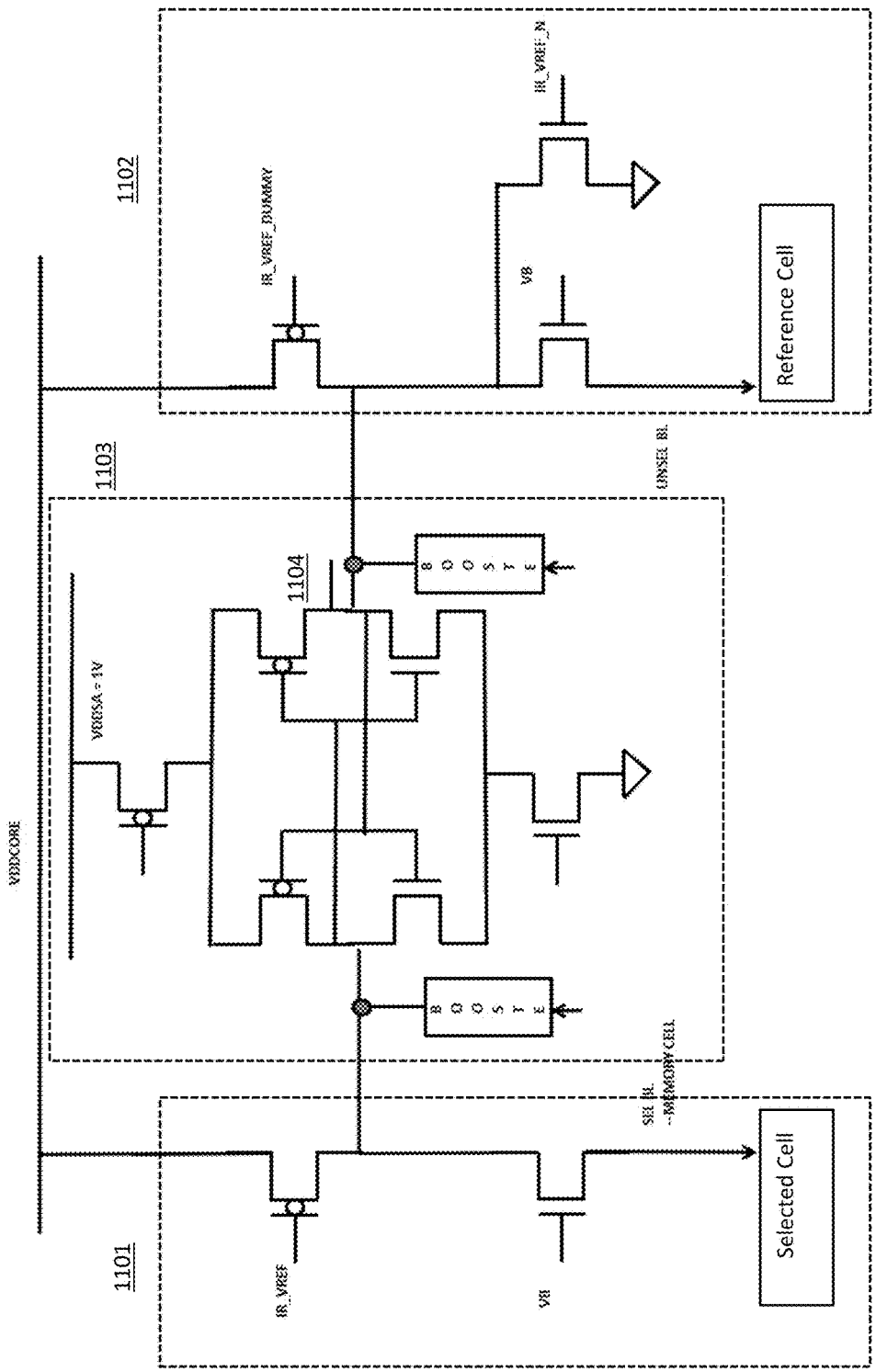
FIG. 11 depicts another embodiment of a sense amplifier circuit.

Another embodiment of an improved sense amplifier circuit is shown in FIG. 11. FIG. 11 depicts sense amplifier circuit 1100, which comprises memory data read block 1101, memory reference read block 1102, and differential amplifier 1103 with output 1104. Sense amplifier circuit 1100 is identical to sense amplifier circuit 900 except that sense amplifier circuit 1100 does not contain capacitors 906 and 908.

Figure 12:
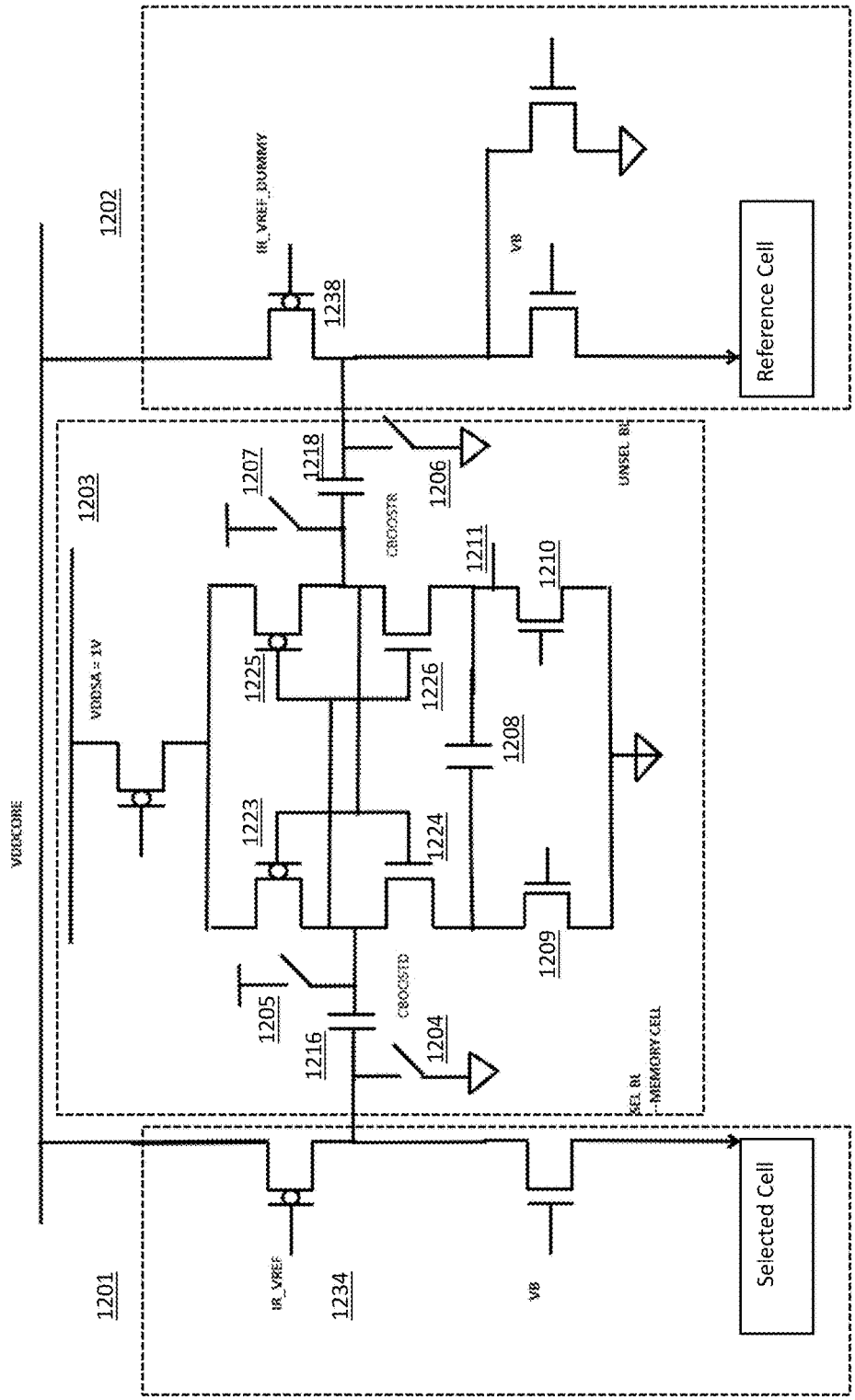
FIG. 12 depicts another embodiment of a sense amplifier circuit.

Another embodiment of an improved sense amplifier circuit is shown in FIG. 12. FIG. 12 depicts sense amplifier circuit 1200, which comprises memory data read block 1201, memory reference read block 1202, and differential amplifier 1203 with output 1211. Sense amplifier circuit 1200 contains many of the same components as sense amplifier circuits 900 and 1100, and those components will not be described again for efficiency's sake.

Differential amplifier 1203 comprises switches 1205 and 1207, which provide a localized voltage boost when opened, and switches 1204 and 1206, which pull input nodes of the comparator portion of differential amplifier 1203 to ground when closed. Initially the switches 1204 and 1206 are closed to pull the first (input) terminals of the capacitors 1216 and 1218 to ground. At the same time, the switches 1205 and 1207 are closed to initialize the other (second) terminals of the capacitors 1216 and 1218 to an initial voltage. Then switches 1204/1206/1205/1207 are opened. Next, PMOS transistors 1234 and 1238 are enabled to pull up the first terminals of capacitors 1216 and 1218 to another voltage level such as core logic supply. By capacitively coupling action of the capacitors 1216 and 1218, the second terminals will increase from the initial voltage to a boosted voltage. Differential amplifier 1203 further comprises capacitor 1208 and NMOS transistors 1209 and 1210, which collectively help to counteract any voltage offset that would otherwise be present in the inputs to the comparator portion due to transistor mismatch or other variances. The differential amplifier 1203 further comprises cross coupled inverter pair 1223/1224 and 1225/1226 with NMOS transistors 1224 and 1226 acting as NMOS input pair with sources decoupled, connecting their sources to the bias current enabling NMOS transistor 1209 and 1210 respectively. Since the input pair has its sources decoupled from each other, they held their self stabilizing gate-source voltage at the initialization period, hence there is no offset between the gate-source voltages of the input pair. This results in reduced offset between the input pair. This scheme will be referred to herein as the cross paired source decoupled comparison scheme, The capacitor 1208 acts to AC short the sources of the transistors 1224 and 1226 together during comparison transient enabling period. Alternatively, capacitor 1208 can be removed.

Figure 13:
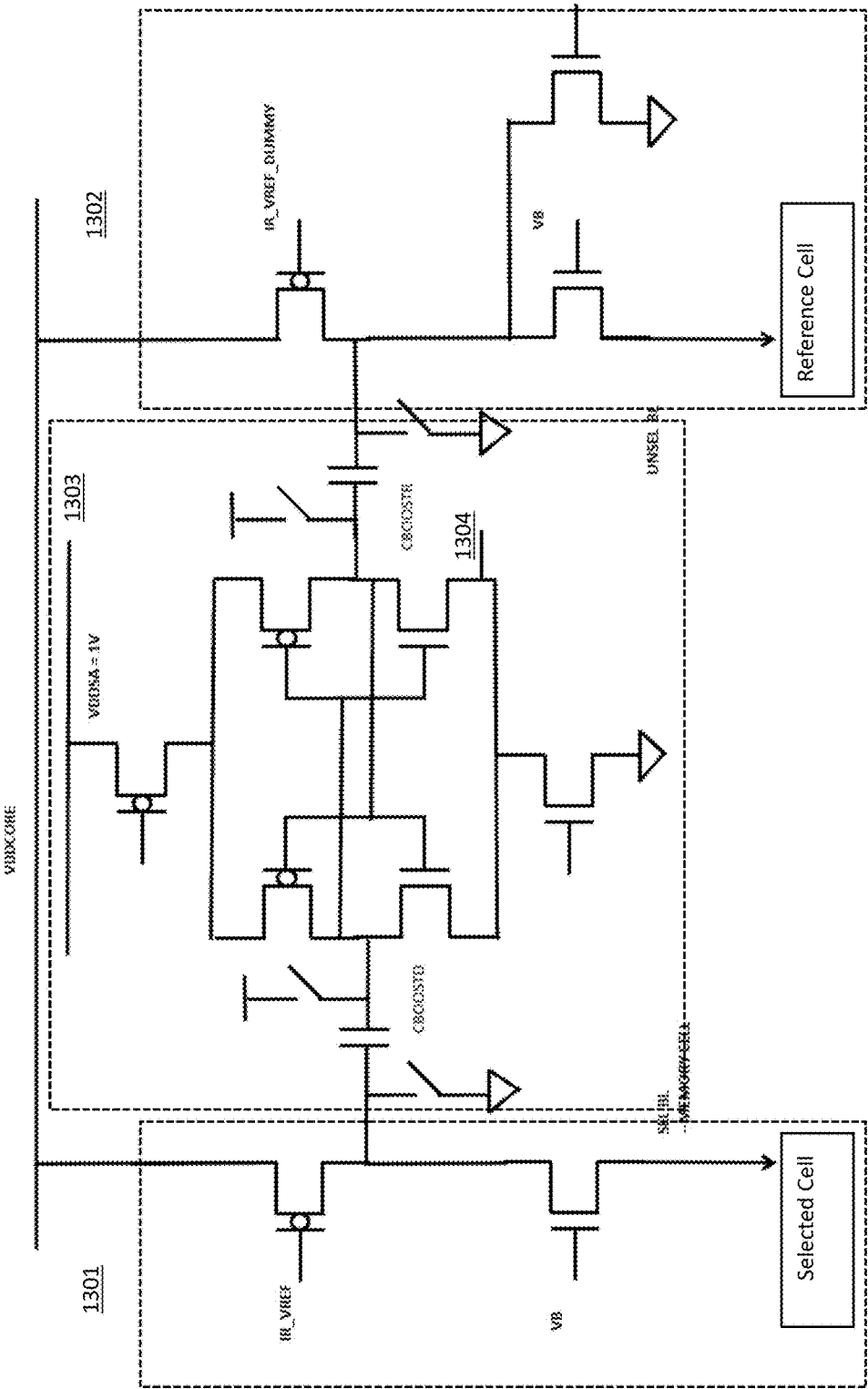
FIG. 13 depicts another embodiment of a sense amplifier circuit.

Another embodiment of an improved sense amplifier circuit is shown in FIG. 13. FIG. 13 depicts sense amplifier circuit 1300, which comprises memory data read block 1301, memory reference read block 1302, and differential amplifier 1303 with output 1304. Sense amplifier circuit 1300 is identical to sense amplifier circuit 1200 except that sense amplifier circuit 1300 does not contain capacitor 1208 and NMOS transistors 1209 and 1210.

Figure 14:
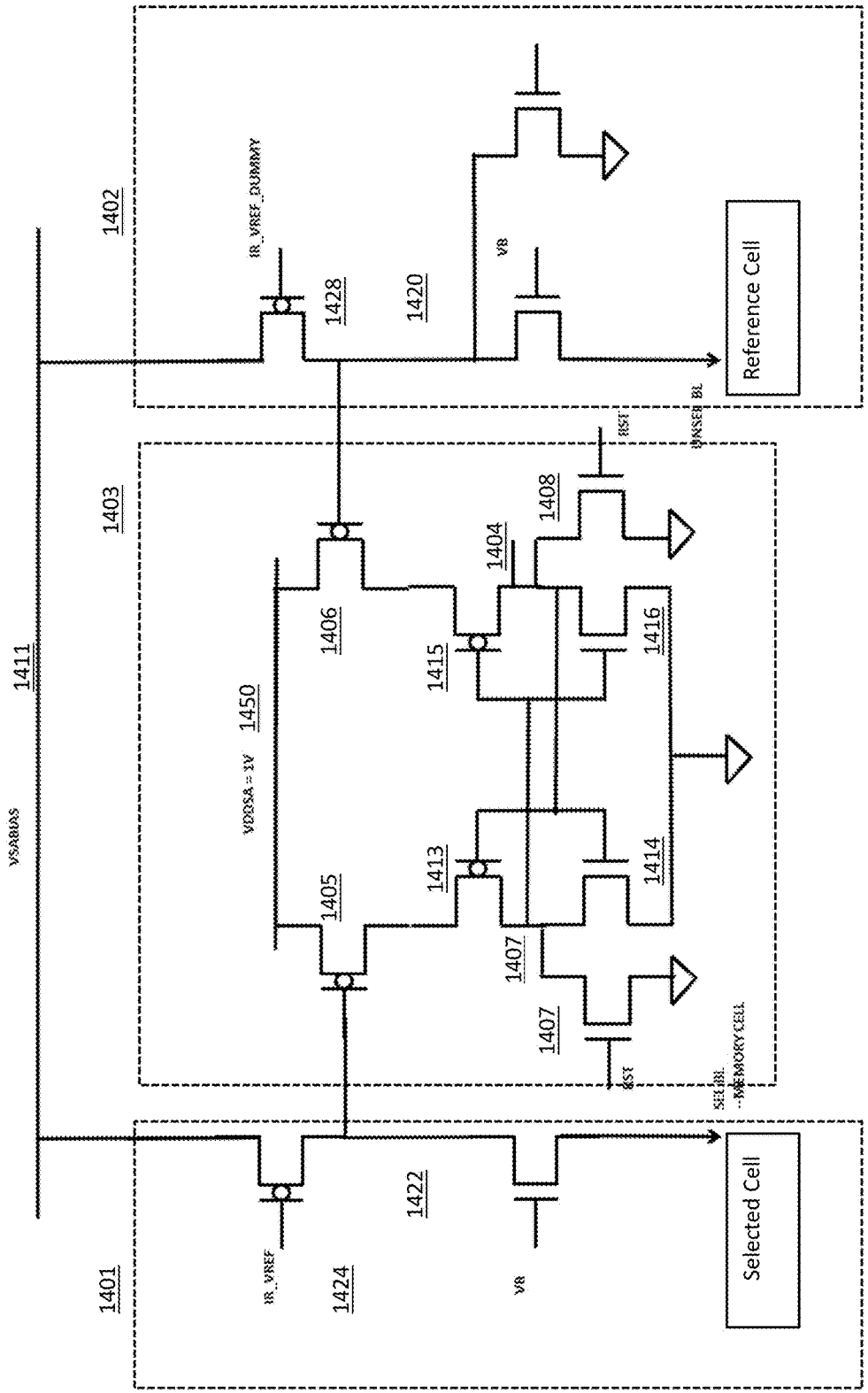
FIG. 14 depicts another embodiment of a sense amplifier circuit.

Another embodiment of an improved sense amplifier circuit is shown in FIG. 14. FIG. 14 depicts sense amplifier circuit 1400, which comprises memory data read block 1401, memory reference read block 1402, and differential amplifier 1403 with output 1404.

Sense amplifier circuit 1400 contains many of the same components as sense amplifier circuits 900, 1100, 1200, and 1300, and those components will not be described again for efficiency's sake. Differential amplifier block 1403 comprises input pair PMOS transistors 1405 and 1406, load cross coupled inverter 1413/1414 and 1415/1416, and current bias enabling NMOS transistors 1407 and 1408, which provide a localized self-timing feature. Sensing node 1422 (from circuit block 1401) and reference node 1420 (from circuit block 1402) couple to the gates of PMOS pair 1405 and 1406. PMOS pair 1405 and 1406 couple their drains to the cross coupled inverters 1413/1414 and 1415/1416. Transistors 1407 and 1408 are used to set the cross coupled inverters 1413/1414 and 1415/1416 to known states before sensing. PMOS transistors 1424 and 1428 are used to pre-charge sensing node 1422 and reference node 1420 to an optimal pre-charged sensing level, such as less than 50 my of the gate-source voltage of the PMOS transistors 1405/1406 (to not turning them on until some valid sensing time development). Operation of circuit 1400 is as follows. An ATD period is used to pre-charge sensing node 1422 and reference node 1420 to a pre-charge level. During this ATD period, NMOS transistors 1407 and 1408 are used to reset output nodes 1404 and 1407 to ground levels. After ATD period, sensing node 1422 starts to ramp down to ground, the rate depending on selected memory cell current. After ATD period, reference node 1420 also starts to ramp down to ground, the rate depending on the read reference current (and/or the reference cell current), respectively. Whichever node falls further along will turn on either the PMOS transistor 1405 or 1406, at which time, power supply 1450 will couple to the cross coupled inverter 1413/1414 and 1415/1416 to turn them on. Assuming sensing node 1422 (sensing memory cell '1') will turn on the PMOS transistor 1405 first, this in turn will turn on PMOS transistor 1413, which couples node 1407 to high voltage which turns off PMOS transistor 1415 automatically. In effect, at this point the output sensing data is latched in the cross coupled inverters 1413/1414 and 1415/1416. At this point, PMOS transistor 1406 does not affect the comparison any more since its sensing path is cut off. Hence, the comparison is automatically complete with full power supply level at nodes 1407 or 1414. For the case of sensing memory cell '0', the situation is reversed with node 1404 going to a high supply level and the PMOS transistor 1413 is cut off. Hence this circuit works with an automatically self-timed sensing and latching scheme.

Figure 15:
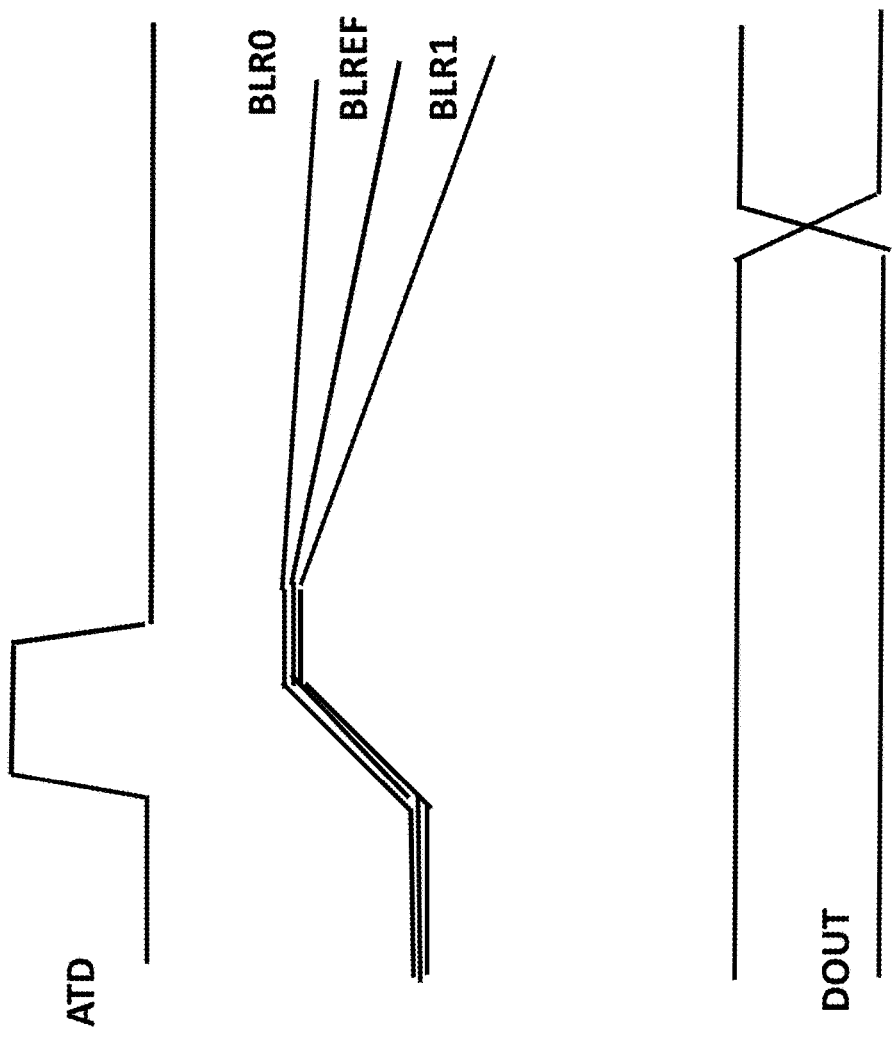
FIG. 15 depicts various waveforms of certain characteristics of the sense amplifier circuit of FIG. 14.

FIG. 15 shows the sensing waveform 1500 for the sensing amplifier 1400. As shown, the DOUT level is sensed at the full power supply level automatically during the sensing period after the ATD equalizing period. There is no enabling (clocking or triggering) signal needed for sensing such as enabling (clocking or triggering) signal going into the gates of the transistor 937 and 932 in FIG. 9.

Figure 16:
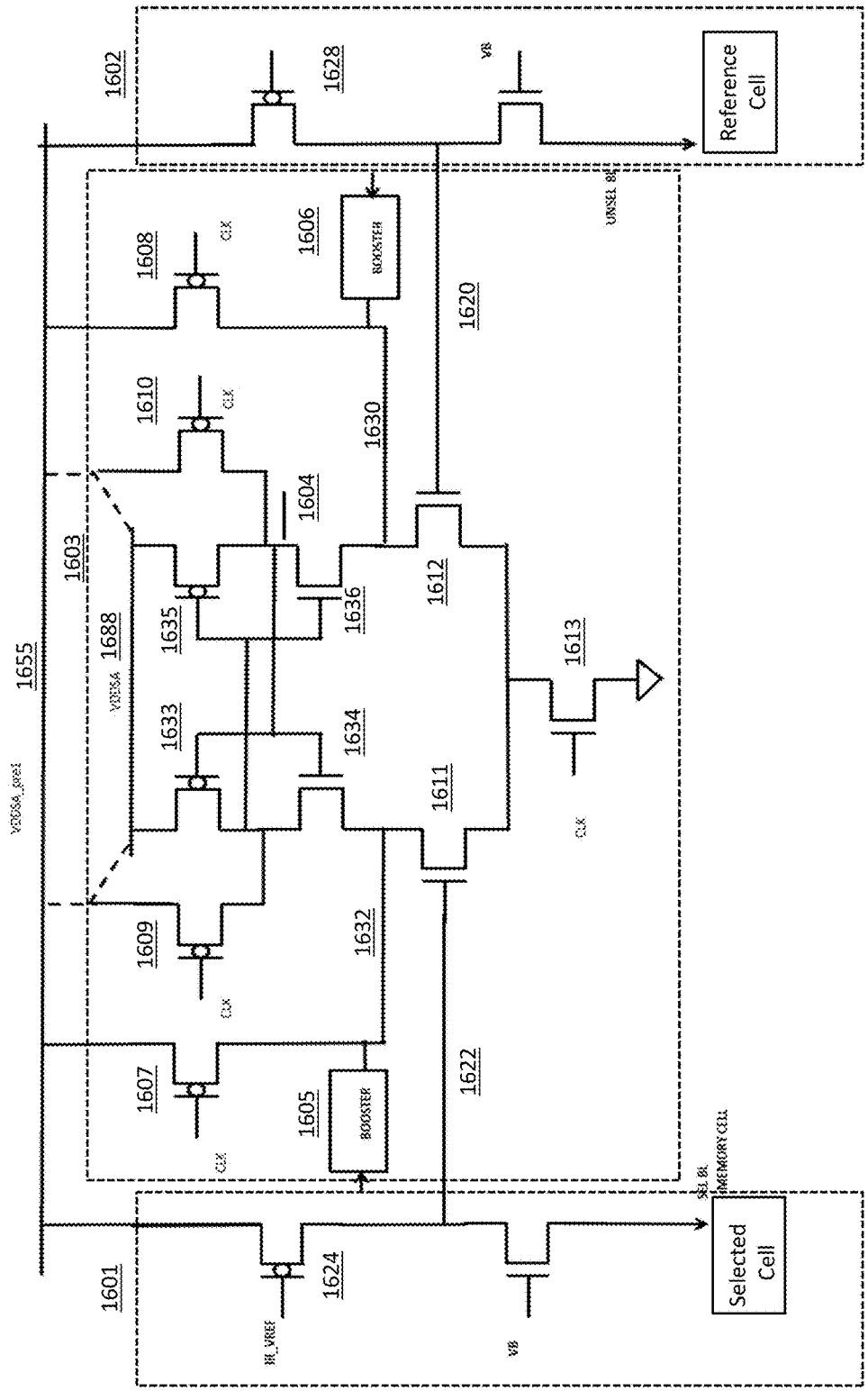
FIG. 16 depicts another embodiment of a sense amplifier circuit.

Another embodiment of an improved sense amplifier circuit is shown in FIG. 16. Sense amplifier circuit 1600 comprises memory data read block 1601, memory reference read block 1602, and differential amplifier 1603 with output 1604.

Sense amplifier circuit 1600 contains many of the same components as sense amplifier circuits 900, 1100, 1200, 1300, and 1400, and those components will not be described again for efficiency's sake. Differential amplifier block 1603 comprises PMOS enabling transistors 1607, 1608, 1609, and 1610; input pair NMOS transistors 1611, 1612, and current bias (enabling) NMOS transistor 1613; and boost circuits 1605 and 1606. NMOS transistors 1611 and 1612 couple their drains, nodes 1632 and 1603 respectively, to cross coupled load inverters 1633/1634 and 1635/1636, respectively. Boost circuits 1605 and 1606 boost the local drain nodes 1632 and 1630 of the input pair NMOS transistors 1611 and 1612 (local sources of the cross coupled NMOS pair 1634 and 1636). Alternatively, the output nodes of the cross coupled load inverters 1633/1634 and 1635/1636 can be boosted. Alternatively, the entire circuit 1603 can be boosted. Sensing node 1622 (provided by the circuit block 1601) and reference node 1620 (provided by the circuit block 1602) couple to the gates of the input NMOS transistor pair 1611 and 1612, respectively.

Figure 17:
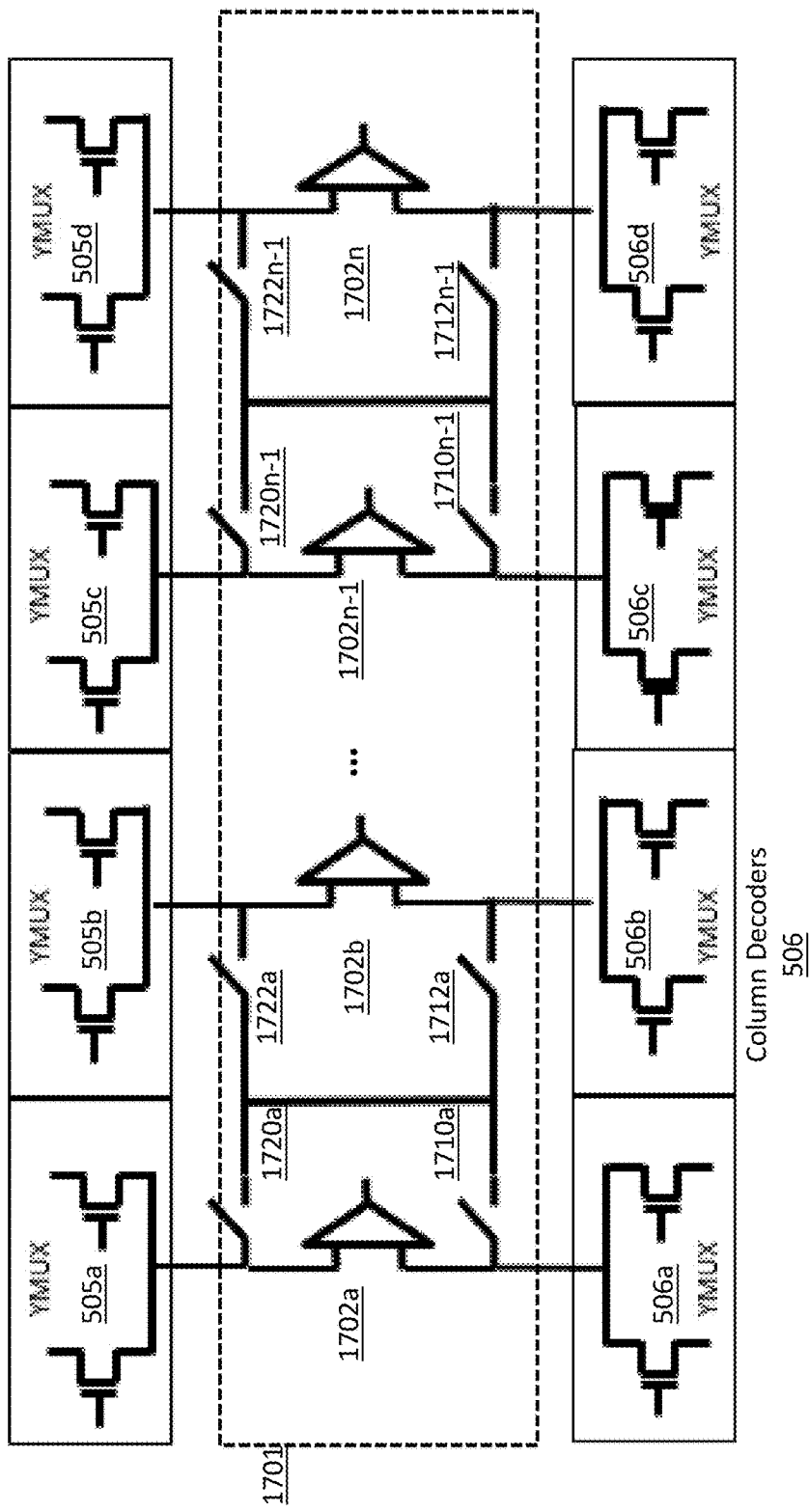
FIG. 17 depicts an embodiment of another flash memory system.

FIG. 17 depicts another embodiment of a flash memory system. Flash memory system 1700 comprises many of the same components as flash memory systems 500 and 600. Flash memory system 1700 has improved accuracy at the expense of slower speed. This scheme can be used, for example, for testing or verifying the margin of the memory array (to avoid such issues as tail distribution or bad, weakly programmed, or weakly erased memory bits) over the operating lifetime of the system. Switches 1710*x*, 1712*x*, 1720*x*, and 1722*x* (where x can range from a to n−1) are used to couple additional bitline capacitances to sensing circuits 1702*x* for the purpose of slowing down the ramping rate (of BLR0/BLR1/BLREF). With slower ramping time, more comparison accuracy is obtained. For example, for sensing circuit 1702*a*, selected bitline connecting from ymux (y-multiplexor) 505*a*, switch 1720*a* and 1712*a* are closed to couple in un-selected bitlines connecting from ymux 506*b*. For the reference side of sensing circuit 1702*a*, connecting through ymux 506*a*, additional un-select bitlines can be connected by enabling through ymux decoding of ymux 506*a*.

In flash memory system 1700, another method of sensing is as follows. A single bit of user data (i.e., a "0" or a "1") is stored in two redundant memory cells (in adjacent columns in the same row) instead of in just one memory cell. During a read operation, both cells are connected to bit lines that provide data to a sense amplifier with appropriate enabling of the switches and decoding. For example, data (either a "1" and "1", or a "0" and "0") can be provided to sense amplifier circuits 1702*a* and 1702*b*. Reference data also will be provided to sense amplifier circuits 1702*a* and 1702*b* from either a reference array, a current mirror, or elsewhere. The output of the two sense amplifier circuits will be XNOR'd (1 and 1=1; 0 and 0=1; 1 and 0=0; 0 and 1=0), and the end result will be the output of the read operation (i.e., the bit of user data that was sought as part of the read operation).

Figure 18:
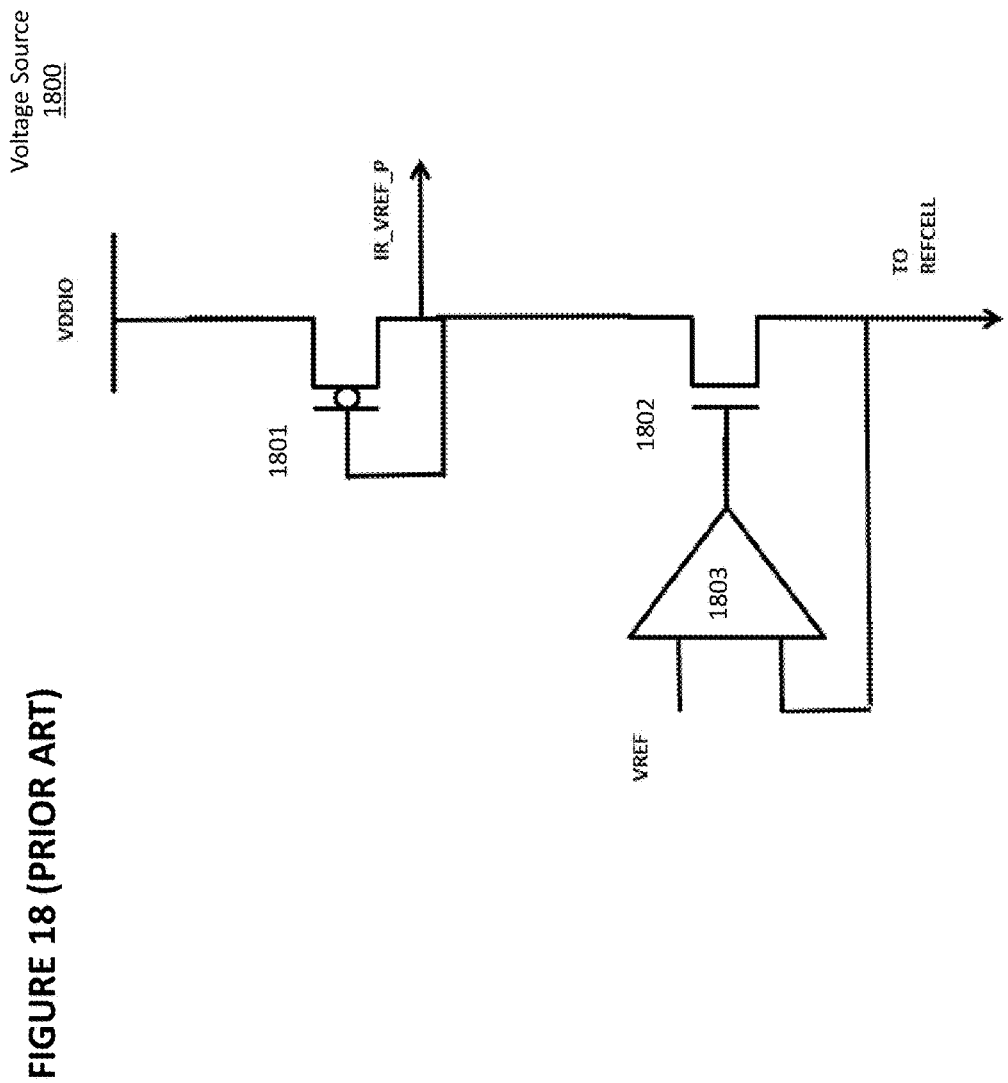
FIG. 18 depicts a prior art voltage source.

FIG. 18 depicts prior art voltage source 1800 used to generate voltage IR_VREF_P, which is used to control the gate of PMOS transistor 704 in FIG. 7. Voltage source 1800 comprises PMOS transistor 1801, NMOS transistor 1802, and comparator 1803. The comparator 1803 and the NMOS transistor form a closed loop to force a fixed VREF voltage into source of the transistor 1802. The source of the transistor 1802 couples to reference cells in a memory array such as the reference array 509 in FIG. 5. Hence, a fixed VREF voltage is superimposed into a reference element such as a bitline of a reference memory cell. Read reference current from a reference cell is then mirrored in the PMOS transistor 1801 into the sensing circuitry.

Figure 19:
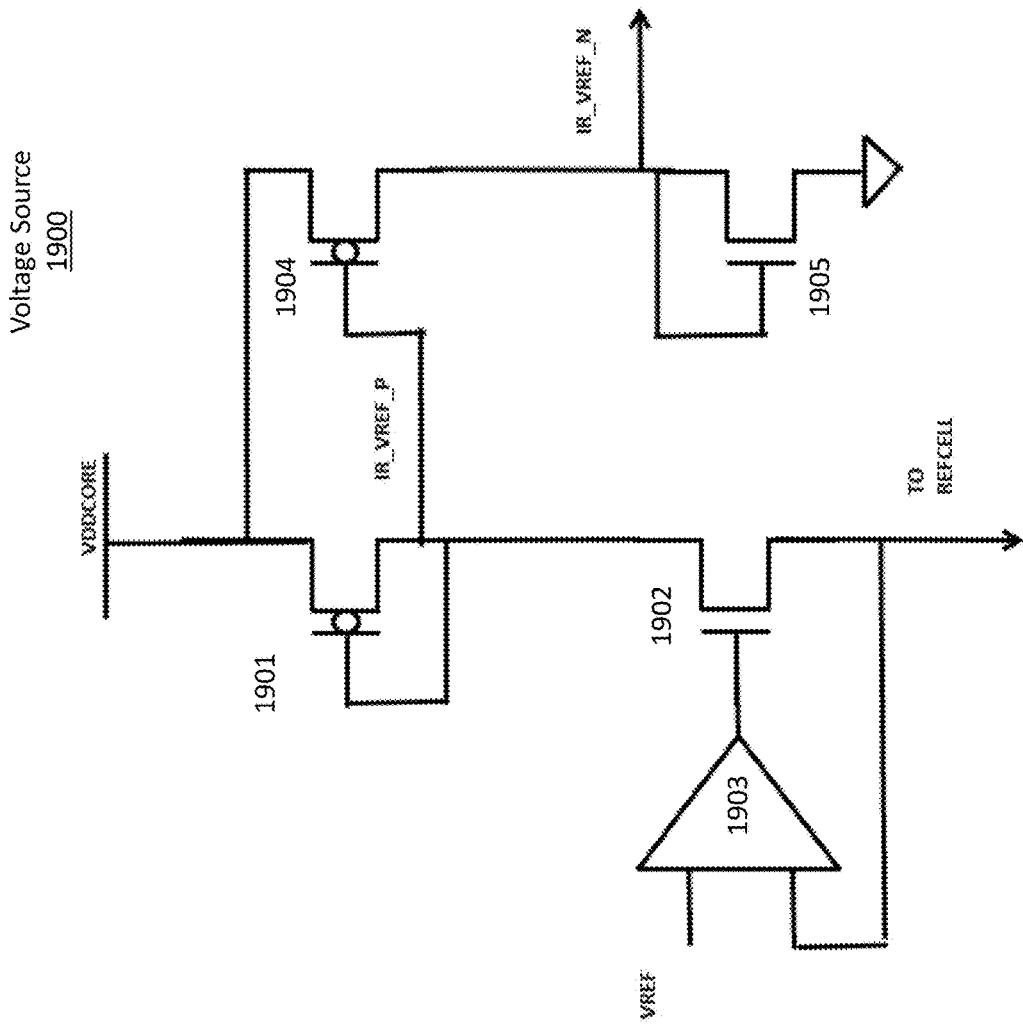
FIG. 19 depicts an embodiment of a voltage source.

FIG. 19 depicts voltage source 1900 used to generate voltage IR_VREF_P and IR_VREF_N for use in the embodiments of sense amplifier circuits described above. Voltage source 1900 comprises PMOS transistor 1901 and 1904, NMOS transistors 1902, 1904, and 1905, and comparator 1903. Read reference current (e.g., from a reference memory cell) in PMOS transistor 1901 is mirrored into PMOS transistor 1904 and is superimposed into diode connected NMOS transistor 1905. The read reference current in NMOS transistor 1905 is then mirrored into sensing circuitry.

Figure 20:
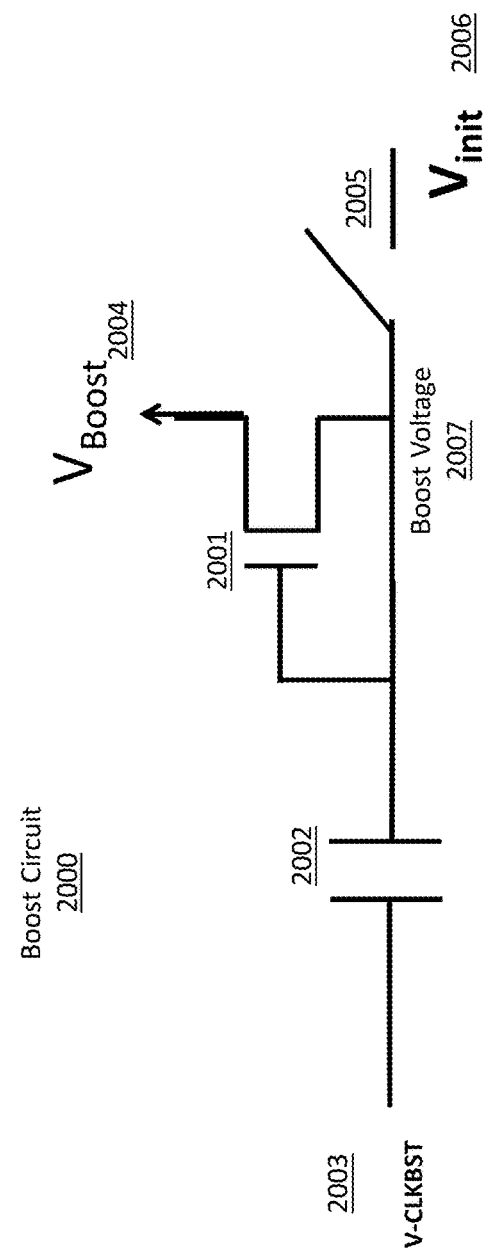
FIG. 20 depicts an embodiment of a voltage boost circuit.
Figure 21:
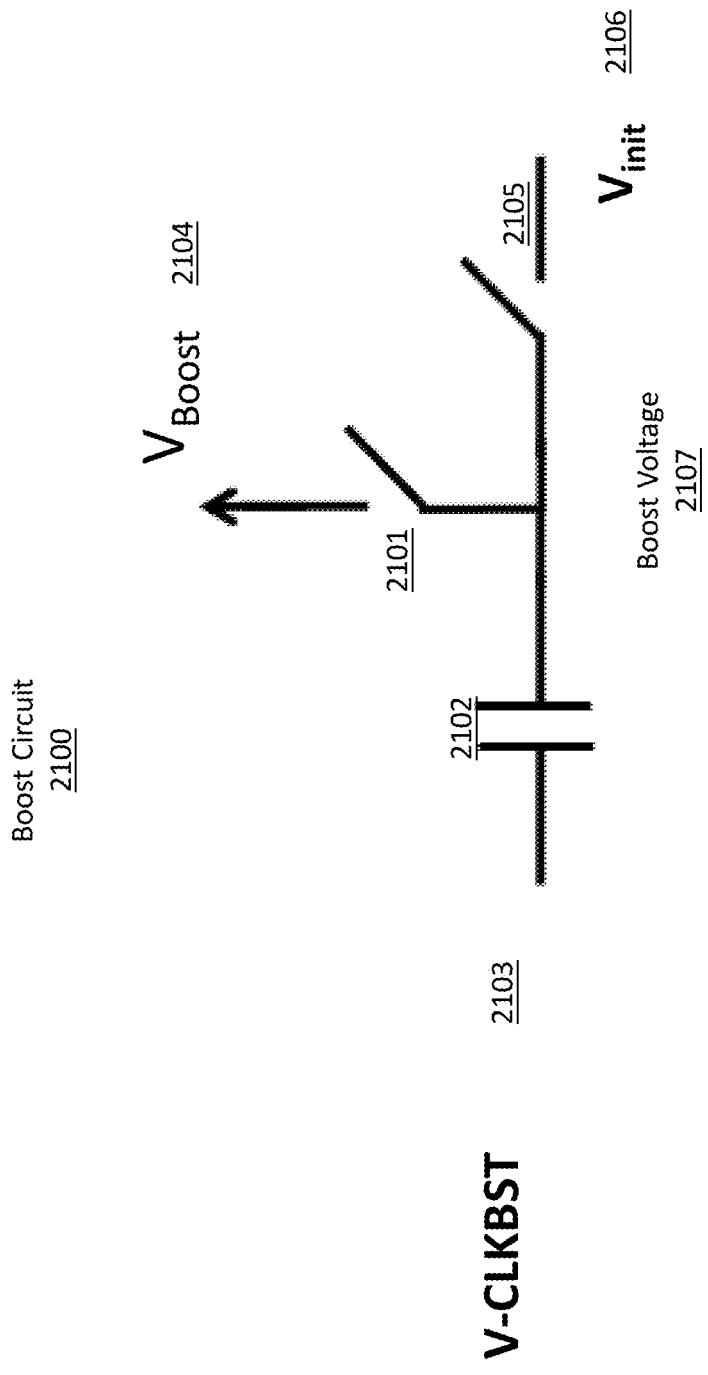
FIG. 21 depicts another embodiment of a voltage boost circuit.

Examples will now be provided with reference to FIGS. 20 and 21 for circuits that can be used as boost circuits 907 and 909 in FIGS. 9 and 11 and boost circuits 1605 and 1606 in FIG. 16.

FIG. 20 depicts boost circuit 2000. Boost circuit 2000 comprises NMOS transistor 2001, capacitor 2002, switch 2005, an initial voltage source Vinit 2006, and input signal 2003 (also labeled V-CLKBST). Another embodiment may have switch 2005 and Vinit 2006 implemented elsewhere in other circuits. Boost circuit 2000 outputs boost voltage $V_{Boost}$ 2004. During operation, initially switch 2005 is turned on to initialize the boost voltage node 2007 to the Vinit voltage 2006 such as core logic supply 1.05 v. Switch 2005 is then turned off. Input signal 2003 then provides a pulse to capacitor 2002, which momentarily increases in voltage the boost voltage node 2007, equals to the Vinit voltage plus voltage level V-CLKBST on the input pulse 2003. The boosted voltage level can be adjusted by adjusting the size of the capacitor 2002 in relation to capacitance at the output node $V_{Boost}$ 2004. This in turns causes NMOS transistor 2001 to turn on and transfer a boosted voltage from the boost voltage node 2007 into the output $V_{Boost}$ 2004 and for boost voltage $V_{Boost}$ 2004 to rise to a level approximately equal to Vinit+V-CLKBST minus the threshold voltage of NMOS transistor 2001. The use of the pulse for input signal 2003 and capacitor 2002 causes boost voltage 2004 to rise only for a limited period of time, providing a transient boost in voltage.

Figure 22:
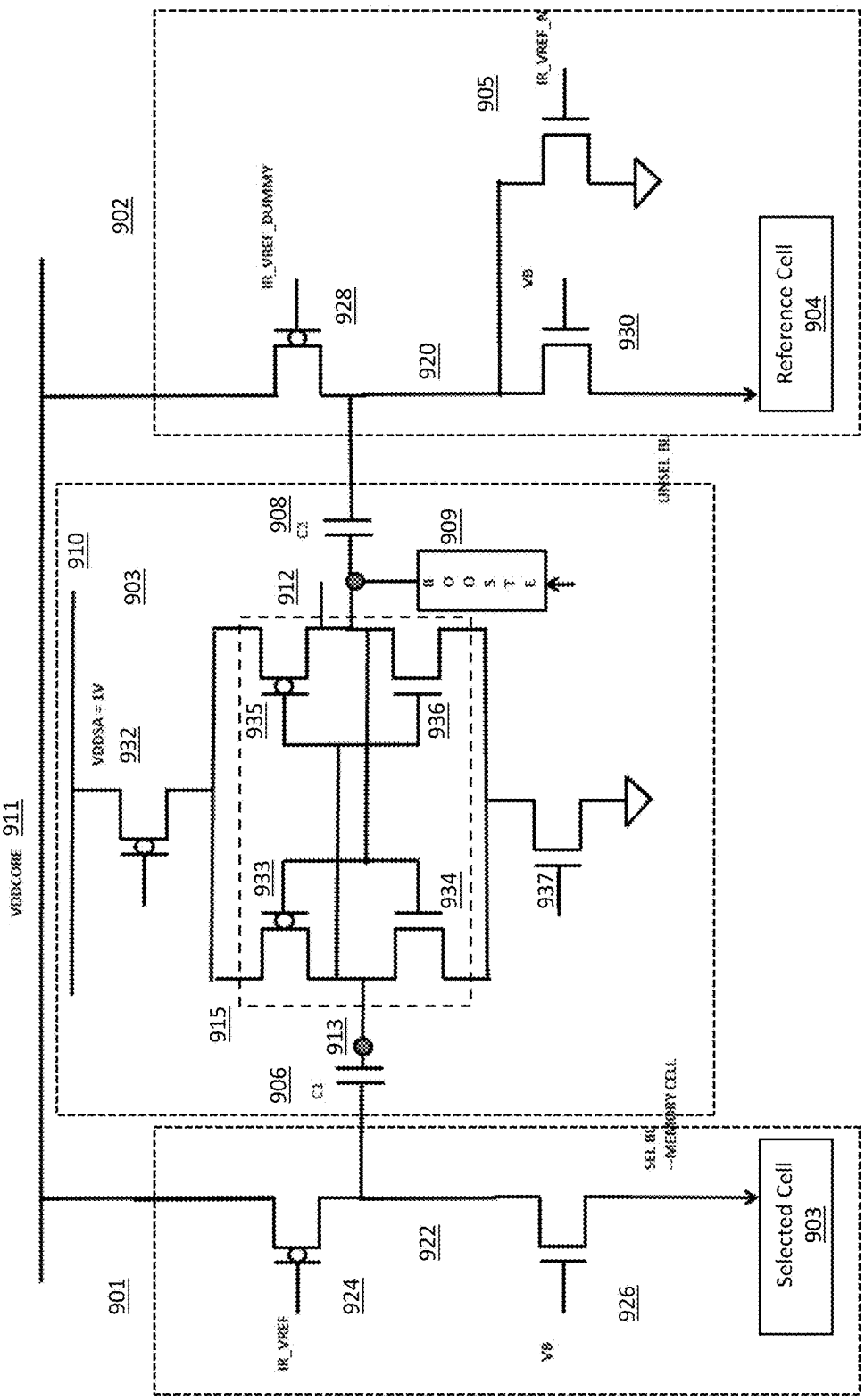
FIG. 22 depicts another embodiment of a sense amplifier circuit.

FIG. 21 depicts boost circuit 2100. Boost circuit 2100 comprises switches 2101 and 2105, capacitor 2102, a Vinit voltage 2106 and input signal 2103 (also labeled V-CLK-BST). Boost circuit 2100 outputs boost voltage $V_{Boost}$ 2104. During operation, initially switches 2105 and 2101 are turned on to initialize the boost voltage node 2107 and the output node $V_{Boost}$ 2104 to the Vinit voltage 2108, such as core logic supply 1.05 v. Switch 2105 is then turned off. Input signal 2103 then provides a pulse to capacitor 2102, which momentarily increases in voltage, causing boost voltage 2107 and the output node $V_{Boost}$ 2104 to rise to a level approximately equal to the Vinit voltage plus voltage level V-CLKBST on the input pulse 2103. The boosted voltage level can be adjusted by adjusting the size of the capacitor 2102 in relation to capacitance at the output node $V_{Boost}$ 2104. Switch 2101 is then turned off to isolate the output node $V_{Boost}$ 2104 from the boost voltage node 2107. In the sensing circuits described above, the boosting circuits are applied to both inputs to the differential amplifiers. Alternative embodiments can utilize a boosting circuit on only one of the inputs to the differential amplifier of FIG. 7-16. For example, in FIG. 9, only boosting circuit 909 can be used to boost reference node 920 to a higher voltage level. This is depicted in FIG. 22, where sense amplifier circuit 2200 is identical the sense amplifier circuit 900 in FIG. 9 except that boost circuit 907 has been removed. This creates an offset for the sensing operation that favors sensing a '1' in the selected memory cell. Alternatively, one-sided boosted differential sensing can be implemented to favor sensing a '0' in the selected memory cell. Similar alterations can be made to the sense amplifier circuits of FIGS. 7-8 and 10-16.

What is claimed is:

1. A flash memory system, comprising:
    a first array comprising flash memory cells organized into rows and columns;
    a second array comprising flash memory cells organized into rows and columns;
    a sense amplifier circuit coupled to the first array at a first node and coupled to the second array at a second node, the sense amplifier comprising:
        a reference current generator coupled to a reference memory cell in the second array;
        a first circuit block coupled to a selected flash memory cell in the first array;
        a second circuit block coupled to the reference current generator;
        a third circuit block for comparing, in response to a read request, current from the first node with current from the second node and generating an output that indicates a value stored in the selected memory cell;
        a first boost circuit coupled to the first node for boosting the voltage of the first node in response to the read request, the first boost circuit comprising an NMOS transistor comprising a first terminal, a second terminal, and a gate, wherein the first terminal of the NMOS transistor is coupled to a voltage source and the second terminal of the NMOS transistor is coupled to the first node and a capacitor comprising a first terminal and a second terminal, wherein the first terminal of the capacitor receives a control signal and the second terminal of the capacitor is coupled to the gate of the NMOS transistor;
        a second boost circuit coupled to the second node for boosting the voltage of the second node in response to the read request.

2. The system of claim 1, wherein the second array is a dummy array.

3. The system of claim 1, wherein the second array contains user data.

4. The system of claim 1, wherein the first boost circuit is coupled to the first node through a first capacitor and the second boost circuit is coupled to the second node through a second capacitor.

5. The system of claim 1, wherein the second boost circuit comprises:
    an NMOS transistor comprising a first terminal, a second terminal, and a gate, wherein the first terminal of the NMOS transistor is coupled to a voltage source and the second terminal of the NMOS transistor is coupled to the second node;
    a capacitor comprising a first terminal and a second terminal, wherein the first terminal of the capacitor receives a control signal and the second terminal of the capacitor is coupled to the gate of the NMOS transistor.

6. The system of claim 1, wherein the reference current generator comprises a current mirror.

7. The system of claim 1, wherein each of the flash memory cells is a split gate source side injection flash memory cell.

8. The system of claim 1, wherein each of the flash memory cells is a source side injection flash memory cell with tip erase.

9. The system of claim 1, wherein the second boost circuit comprises:
    an NMOS transistor comprising a first terminal, a second terminal, and a gate, wherein the first terminal of the NMOS transistor is coupled to a voltage source and the second terminal of the NMOS transistor is coupled to the second node;
    a capacitor comprising a first terminal and a second terminal, wherein the first terminal of the capacitor receives a control signal and the second terminal of the capacitor is coupled to the gate of the NMOS transistor.

10. A flash memory system, comprising:
    a first array comprising flash memory cells organized into rows and columns;
    a second array comprising flash memory cells organized into rows and columns;
    a sense amplifier circuit coupled to the first array at a first node and coupled to the second array at a second node, the sense amplifier comprising:
        a reference current generator coupled to a reference memory cell in the second array;
        a first circuit block coupled to a selected flash memory cell in the first array;
        a second circuit block coupled to the reference current generator;
        a third circuit block for comparing, in response to a read request, current from the first node with current from the second node and generating an output that indicates a value stored in the selected memory cell;
        a first boost circuit coupled to the first node for boosting the voltage of the first node in response to the read request, the first boost circuit comprising a first switch selectively coupled to a voltage source and a capacitor comprising a first terminal and a second terminal, wherein the first terminal of the capacitor is selectively coupled to a receive a control signal when a first switch is closed and the second terminal of the capacitor is coupled to the first node and is selectively coupled to a voltage source when a second switch is closed; and a second boost circuit coupled to the second node for boosting the voltage of the second node in response to the read request.

11. The system of claim 10, wherein the second boost circuit comprises:
a first switch selectively coupled to a voltage source;
a capacitor comprising a first terminal and a second terminal, wherein the first terminal of the capacitor is selectively coupled to a receive a control signal when a first switch is closed and the second terminal of the capacitor is coupled to the second node and is selectively coupled to a voltage source when a second switch is closed.

12. A flash memory system, comprising:
a first array comprising flash memory cells organized into rows and columns;
a second array comprising flash memory cells organized into rows and columns;
a sense amplifier circuit coupled to the first array at a first node and coupled to the second array at a second node, the sense amplifier comprising:
a first circuit block coupled to a selected flash memory cell in the first array;
a second circuit block coupled to a reference flash memory cell in the second array;
a third circuit block for comparing, in response to a read request, current from the first node with current from the second node and generating an output that indicates a value stored in the selected memory cell;
a first boost circuit coupled to the first node for boosting the voltage of the first node in response to the read request, the first boost circuit comprising an NMOS transistor comprising a first terminal, a second terminal, and a gate, wherein the first terminal of the NMOS transistor is coupled to a voltage source and the second terminal of the NMOS transistor is coupled to the first node and a capacitor comprising a first terminal and a second terminal, wherein the first terminal of the capacitor receives a control signal and the second terminal of the capacitor is coupled to the gate of the NMOS transistor; and
a second boost circuit coupled to the second node for boosting the voltage of the second node in response to the read request.

13. The system of claim 12, wherein the second array is a dummy array.

14. The system of claim 12, wherein the second array contains user data.

15. The system of claim 12, wherein the first boost circuit is coupled to the first node through a first capacitor and the second boost circuit is coupled to the second node through a second capacitor.

16. The system of claim 12, wherein the reference current generator comprises a current mirror.

17. The system of claim 12, wherein each of the flash memory cells is a split gate source side injection flash memory cell.

18. The system of claim 12, wherein each of the flash memory cells is a source side injection flash memory cell with tip erase.

19. A flash memory system, comprising:
a first array comprising flash memory cells organized into rows and columns;
a second array comprising flash memory cells organized into rows and columns;
a sense amplifier circuit coupled to the first array at a first node and coupled to the second array at a second node, the sense amplifier comprising:
a first circuit block coupled to a selected flash memory cell in the first array;
a second circuit block coupled to a reference flash memory cell in the second array;
a third circuit block for comparing, in response to a read request, current from the first node with current from the second node and generating an output that indicates a value stored in the selected memory cell;
a first boost circuit coupled to the first node for boosting the voltage of the first node in response to the read request, the first boost circuit comprising a first switch selectively coupled to a voltage source and a capacitor comprising a first terminal and a second terminal, wherein the first terminal of the capacitor is selectively coupled to receive a control signal when a first switch is closed and the second terminal of the capacitor is coupled to the first node and is selectively coupled to a voltage source when a second switch is closed; and
a second boost circuit coupled to the second node for boosting the voltage of the second node in response to the read request.

20. The system of claim 19, wherein the second boost circuit comprises:
a first switch selectively coupled to a voltage source;
a capacitor comprising a first terminal and a second terminal, wherein the first terminal of the capacitor is selectively coupled to receive a control signal when a first switch is closed and the second terminal of the capacitor is coupled to the second node and is selectively coupled to a voltage source when a second switch is closed.

21. A flash memory system, comprising:
a first array comprising flash memory cells organized into rows and columns;
a second array comprising flash memory cells organized into rows and columns;
a sense amplifier circuit coupled to the first array at a first node and coupled to the second array at a second node, the sense amplifier comprising:
a reference current generator coupled to a reference memory cell in the second array;
a first circuit block coupled to a selected flash memory cell in the first array;
a second circuit block coupled to the reference current generator;
a third circuit block for comparing, in response to a read request, current from the first node with current from the second node and generating an output that indicates a value stored in the selected memory cell; and
a boost circuit coupled to the first node or the second node for boosting the voltage of the first node or the second node in response to the read request, the boost circuit comprising an NMOS transistor comprising a first terminal, a second terminal, and a gate, wherein the first terminal of the NMOS transistor is coupled to a voltage source and the second terminal of the NMOS transistor is coupled to the first node and a capacitor comprising a first terminal and a second terminal, wherein the first terminal of the capacitor receives a control signal and the second terminal of the capacitor is coupled to the gate of the NMOS transistor.

22. The system of claim 21, wherein the second array is a dummy array.

23. The system of claim 21, wherein the second array contains user data.

24. The system of claim 21, wherein the boost circuit is coupled to the first node or the second node through a capacitor.

25. The system of claim 21, wherein the reference current generator comprises a current mirror.

26. The system of claim 21, wherein each of the flash memory cells is a split gate source side injection flash memory cell.

27. The system of claim 21, wherein each of the flash memory cells is a source side injection flash memory cell with tip erase.

28. A flash memory system, comprising:
a first array comprising flash memory cells organized into rows and columns;
a second array comprising flash memory cells organized into rows and columns;
a sense amplifier circuit coupled to the first array at a first node and coupled to the second array at a second node, the sense amplifier comprising:
a reference current generator coupled to a reference memory cell in the second array;
a first circuit block coupled to a selected flash memory cell in the first array;
a second circuit block coupled to the reference current generator;
a third circuit block for comparing, in response to a read request, current from the first node with current from the second node and generating an output that indicates a value stored in the selected memory cell; and
a boost circuit coupled to the first node or the second node for boosting the voltage of the first node or the second node in response to the read request, the boost circuit comprising a first switch selectively coupled to a voltage source and a capacitor comprising a first terminal and a second terminal, wherein the first terminal of the capacitor is selectively coupled to receive a control signal when a first switch is closed and the second terminal of the capacitor is coupled to the first node and is selectively coupled to a voltage source when a second switch is closed.

29. A flash memory system, comprising:
a first array comprising flash memory cells organized into rows and columns;
a second array comprising flash memory cells organized into rows and columns;
a sense amplifier circuit coupled to the first array at a first node and coupled to the second array at a second node, the sense amplifier comprising:
a first circuit block coupled to a selected flash memory cell in the first array;
a second circuit block coupled to a reference flash memory cell in the second array;
a third circuit block for comparing, in response to a read request, current from the first node with current from the second node and generating an output that indicates a value stored in the selected memory cell;
a boost circuit coupled to the first node or the second node for boosting the voltage of the first node or the second node in response to the read request, the boost circuit comprising an NMOS transistor comprising a first terminal, a second terminal, and a gate, wherein the first terminal of the NMOS transistor is coupled to a voltage source and the second terminal of the NMOS transistor is coupled to the first node and a capacitor comprising a first terminal and a second terminal, wherein the first terminal of the capacitor receives a control signal and the second terminal of the capacitor is coupled to the gate of the NMOS transistor.

30. The system of claim 29, wherein the second array is a dummy array.

31. The system of claim 29, wherein the second array contains user data.

32. The system of claim 29, wherein the boost circuit is coupled to the first node or the second node through a capacitor.

33. The system of claim 29, wherein the reference current generator comprises a current mirror.

34. The system of claim 29, wherein each of the flash memory cells is a split gate source side injection flash memory cell.

35. The system of claim 29, wherein each of the flash memory cells is a source side injection flash memory cell with tip erase.

36. A flash memory system, comprising:
a first array comprising flash memory cells organized into rows and columns;
a second array comprising flash memory cells organized into rows and columns;
a sense amplifier circuit coupled to the first array at a first node and coupled to the second array at a second node, the sense amplifier comprising:
a first circuit block coupled to a selected flash memory cell in the first array;
a second circuit block coupled to a reference flash memory cell in the second array;
a third circuit block for comparing, in response to a read request, current from the first node with current from the second node and generating an output that indicates a value stored in the selected memory cell; and
a boost circuit coupled to the first node or the second node for boosting the voltage of the first node or the second node in response to the read request, the boost circuit comprising a first switch selectively coupled to a voltage source and a capacitor comprising a first terminal and a second terminal, wherein the first terminal of the capacitor is selectively coupled to receive a control signal when a first switch is closed and the second terminal of the capacitor is coupled to the first node and is selectively coupled to a voltage source when a second switch is closed.

37. A flash memory sense amplifier coupled to a data memory array at a first node and a reference circuit at a second node, comprising:
a first circuit block coupled to a selected flash memory cell in the data memory array;
a second circuit block coupled to the reference circuit;
a third circuit block for comparing, in response to a read request, current from the first node with current from the second node and generating an output that indicates a value stored in the selected memory cell;
a first boost circuit coupled to the second node for boosting the voltage of the second node in response to the read request; and one or more pre-charge circuits for pre-charging the first node to a bias voltage level and pre-charging the second node to a bias voltage level.

38. The flash memory sense amplifier of claim 37, wherein the third circuit block is configured to compare current from the first node with current from the second node while a voltage of the first node and a voltage of the second node are ramping down after the one or more pre-charge circuits apply a pre-charge to the first node and a pre-charge to the second node.

39. The flash memory sense amplifier of claim 37, wherein the first circuit block comprises a capacitor coupled to the first node for decoupling the third circuit block from the data memory array, and wherein the second circuit block comprises a capacitor coupled to the second node for decoupling the third circuit block from the reference circuit.

40. The flash memory sense amplifier of claim 37, further comprising a second boost circuit coupled to the first node for boosting the voltage of the first node in response to the read request.

41. A flash memory source decoupled sense amplifier coupled to a data memory array at a first node and coupled to a reference circuit at a second node, the flash memory source decoupled sense amplifier comprising:
 a source decoupled input pair circuit block for comparing, in response to a read request, current from the first node with current from the second node and generating an output that indicates a value stored in the selected memory cell;
 a first boost circuit coupled to the second node for boosting the voltage of the second node in response to the read request; and
 one or more pre-charge circuits for pre-charging the first node to a bias voltage level and pre-charging the second node to a bias voltage level.

42. The flash memory source decoupled sense amplifier of claim 41, wherein the source decoupled input pair circuit block is configured to compare current from the first node with current from the second node while a voltage of the first node and a voltage of the second node are ramping down after the one or more pre-charge circuits apply a pre-charge to the first node and a pre-charge to the second node.

43. The flash memory source decoupled sense amplifier of claim 41, wherein the source decoupled input pair circuit block comprises a capacitor coupled to the first node for decoupling the source decoupled input pair circuit block from the data memory array, and wherein the second circuit block comprises a capacitor coupled to the second node for decoupling the source decoupled input pair circuit block from the reference circuit.

44. The flash memory source decoupled sense amplifier of claim 41, further comprising a second boost circuit coupled to the first node for boosting the voltage of the first node in response to the read request.

45. A flash memory self-timed sense amplifier coupled to a data memory array at a first node and coupled to a reference circuit at a second node, the flash memory self-times sense amplifier comprising:
 a differential amplifier circuit block for comparing, in response to a read request, current from the first node with current from the second node and generating an output that indicates a value stored in a selected memory cell in the data memory array, the differential amplifier circuit block comprising a self-timed sensing and latching circuit; and
 one or more pre-charge circuits for pre-charging the first node to a bias voltage level and pre-charging the second node to a bias voltage level.

46. The flash memory self-timed source decoupled sense amplifier of claim 45, wherein the differential amplifier circuit block is configured to compare current from the first node with current from the second node while a voltage of the first node and a voltage of the second node are ramping down after the one or more pre-charge circuits apply a pre-charge to the first node and a pre-charge to the second node.

47. The flash memory self-timed source decoupled sense amplifier of claim 45, wherein the self-timed sensing and latching circuit is configured to self-latch when the differential amplifier circuit block is comparing current from the first node with current from the second node.

48. The flash memory self-timed source decoupled sense amplifier of claim 45, further comprising:
 a first boost circuit coupled to the first node for boosting the voltage of the first node in response to the read request; and
 a second boost circuit coupled to the second node for boosting the voltage of the second node in response to the read request.

49. The flash memory self-timed source decoupled sense amplifier of claim 45, wherein the differential amplifier circuit block comprises a capacitor coupled to the first node for decoupling the differential amplifier circuit block from the data memory array, and wherein the second circuit block comprises a capacitor coupled to the second node for decoupling the differential amplifier circuit block from the reference circuit.

50. A flash memory sense amplifier coupled to a data memory array at a first node and to a reference circuit at a second node, the flash memory sense amplifier comprising:
 a first circuit block coupled to a selected flash memory cell in the data memory array;
 a second circuit block coupled to the reference circuit;
 a third circuit block for comparing, in response to a read request, current from the selected memory cell with read reference current from the reference circuit and generating an output that indicates a value stored in the selected memory cell;
 a first boost circuit coupled to a first source node of a cross coupled NMOS pair of the third circuit block for boosting the voltage of the first source node in response to the read request;
 a second boost circuit coupled to a second source node of the cross coupled NMOS pair of the third circuit block for boosting the voltage of the second source node in response to the read request.

51. The flash memory sense amplifier of claim 50, further comprising one or more pre-charge circuits for pre-charging the first node to a bias voltage level and pre-charging the second node to a bias voltage level.

52. The flash memory sense amplifier of claim 50, wherein the first circuit block comprises a capacitor coupled to the first node for decoupling the third circuit block from the data memory array, and wherein the third circuit block comprises a capacitor coupled to the second node for decoupling the third circuit block from the reference circuit.

53. The flash memory sense amplifier of claim 50, wherein the selected memory cell is a split gate source side injection flash memory cell.

54. The flash memory sense amplifier of claim 50, wherein the selected memory cell is a source side injection flash memory cell with tip erase.

55. A flash memory sense amplifier coupled to a data memory array at a first node and coupled to a reference circuit at a second node, the flash memory sense amplifier comprising:
- a first circuit block coupled to a selected flash memory cell in the data memory array;
- a second circuit block coupled to the reference circuit;
- a third circuit block for comparing, in response to a read request, current from the selected memory cell with current from the reference circuit and generating an output that indicates a value stored in the selected memory cell;
- a first boost circuit coupled to a first source node of the third circuit block for boosting the voltage of the first source node in response to the read request; and
- a second boost circuit coupled to a second node of the third circuit block for boosting the voltage of the second source node in response to the read request; and
- one or more pre-charge circuits for pre-charging the first node to a bias voltage level and pre-charging the second node to a bias voltage level.

56. The flash memory sense amplifier of claim 55, wherein the first circuit block comprises a capacitor coupled to the first node for decoupling the third circuit block from the data memory array, and wherein the third circuit block comprises a capacitor coupled to the second node for decoupling the third circuit block from the reference circuit.

57. The flash memory sense amplifier of claim 55, wherein the selected memory cell is a split gate source side injection flash memory cell.

58. The flash memory sense amplifier of claim 55, wherein the selected memory cell is a source side injection flash memory cell with tip erase.

59. The flash memory sense amplifier of claim 55, wherein the reference circuit comprises unselected bitlines coupled to the second circuit block.

60. The flash memory sense amplifier of claim 55, wherein all transistors in the flash memory sense amplifier operate using a supply voltage utilized by the flash memory cells in the data memory array.

61. A method of determining a value stored in a selected memory cell in a flash memory system comprising a first array of flash memory cells, a second array of flash memory cells, and a sense amplifier circuit, the method comprising:
- boosting a voltage at a first node in the sense amplifier circuit;
- boosting a voltage at a second node in the sense amplifier circuit;
- connecting the selected memory cell to the sense amplifier circuit;
- connecting a reference memory cell to the sense amplifier circuit;
- comparing current at the first node and current at the second node and generating an output indicating a value stored in the selected memory cell.

62. The method of claim 61, wherein the selected memory cell is a split gate source side injection flash memory cell.

63. The method of claim 61, wherein the selected memory cell is a source side injection flash memory cell with tip erase.

64. A method of sensing a selected flash memory cell, comprising:
- precharging a sensing node to a precharge voltage level, wherein the sensing node is coupled to the selected flash memory cell;
- boosting the voltage of the sensing node to a boosted voltage level higher than the precharge voltage level; and
- comparing the sensing node to a reference node to determine a value stored in the selected flash memory cell.

65. The method of claim 64, wherein the comparing step occurs while the voltage of the sensing node is ramping down.

66. The method of claim 65, wherein the comparing step occurs while the voltage of the reference node is ramping down.

67. The method of claim 64, further comprising boosting the voltage of the reference node.

68. The method of claim 64, wherein the reference node is coupled to a read reference bias source.

69. The method of claim 68, wherein the read reference bias source comprises a reference array.

70. The method of claim 64, wherein the sensing node is decoupled from the selected flash memory cell by a capacitor.

71. The method of claim 64, wherein the comparing step is performed by a differential amplifier.

72. The method of claim 64, wherein the comparing step is performed by a differential amplifier.

73. The method of claim 72, wherein the sensing node and the reference node are sources of a crossed-coupled NMOS pair of the differential amplifier.

74. The method of claim 73, wherein the sensing node and the reference node are coupled to drains of an input pair of the differential amplifier.

75. The method of claim 72, wherein the different amplifier comprises an input transistor pair having decoupled sources.

76. The method of claim 64, wherein the comparing step comprises self-timed, automatic latching of an output indicating the value stored in the selected memory cell.

77. The method of claim 64, wherein the selected memory cell is a split gate source side injection flash memory cell.

78. The method of claim 64, wherein the selected memory cell is a source side injection flash memory cell with tip erase.

* * * * *